(12) United States Patent
Grebs et al.

(10) Patent No.: US 7,476,589 B2
(45) Date of Patent: Jan. 13, 2009

(54) METHODS FOR FORMING SHIELDED GATE FIELD EFFECT TRANSISTORS

(75) Inventors: Thomas E. Grebs, Mountain Top, PA (US); Nathan Lawrence Kraft, Pottsville, PA (US); Rodney Ridley, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 184 days.

(21) Appl. No.: 11/479,117

(22) Filed: Jun. 29, 2006

(65) Prior Publication Data

US 2007/0032020 A1 Feb. 8, 2007

Related U.S. Application Data

(60) Provisional application No. 60/695,718, filed on Jun. 29, 2005.

(51) Int. Cl.
*H01L 21/336* (2006.01)
*H01L 21/4763* (2006.01)
(52) U.S. Cl. ............. 438/270; 438/259; 438/589; 257/E21.158; 257/E21.4; 257/E21.419
(58) Field of Classification Search .......... 257/E21.158, 257/E21.4, E21.419
See application file for complete search history.

(56) References Cited

U.S. PATENT DOCUMENTS

| | | | |
|---|---|---|---|
| 7,005,351 B2 | 2/2006 | Henninger et al. | |
| 7,319,256 B1 | 1/2008 | Kraft et al. | |
| 7,345,342 B2 | 3/2008 | Challa et al. | |
| 7,393,749 B2* | 7/2008 | Yilmaz et al. | 438/259 |
| 7,416,948 B2* | 8/2008 | Kraft et al. | 438/270 |
| 2006/0267090 A1* | 11/2006 | Sapp et al. | 257/341 |
| 2006/0273386 A1 | 12/2006 | Yilmaz et al. | |
| 2006/0289929 A1* | 12/2006 | Andrews | 257/330 |
| 2007/0032020 A1 | 2/2007 | Grebs et al. | |

OTHER PUBLICATIONS

International Search Report for PCT/US06/25432 filed Jun. 29, 2006 with the Written Opinion of the International Searching Authority.
Silicon VLSI Technology Fundamentals, Practice and Modeling, J.D. Plummer, M.D. Deal, P.B. Griffin, Prentice Hall, 2000, pp. 605-615.

* cited by examiner

*Primary Examiner*—Charles D Garber
*Assistant Examiner*—Mohsen Ahmadi
(74) *Attorney, Agent, or Firm*—Townsend and Townsend and Crew LLP

(57) ABSTRACT

A field effect transistor is formed as follows. A trench is formed in a semiconductor region. A dielectric layer lining the trench sidewalls and bottom is formed. The trench is filled with a conductive material. The conductive material is recessed into the trench to thereby form a shield electrode in a bottom portion of the trench. The recessing of the conductive material includes isotropic etching of the conductive material. An inter-electrode dielectric (IED) is formed over the recessed shield electrode.

18 Claims, 19 Drawing Sheets

US 7,476,589 B2

METHODS FOR FORMING SHIELDED GATE FIELD EFFECT TRANSISTORS

CROSS-REFERENCES TO RELATED APPLICATIONS

This application claims the benefit of U.S. Provisional Application No. 60/695,718, filed Jun. 29, 2005, which is incorporated herein by reference in its entirety for all purposes.

BACKGROUND OF THE INVENTION

The present invention relates to semiconductor power field effect transistors (FETs), and more particularly to structures and methods for forming improved shielded gate FETs.

Shielded gate trench FETs are advantageous over conventional field effect transistor devices in that the shield electrode reduces the gate-drain capacitance (Cgd) and improves the breakdown voltage of the transistor. However, further improvements can be made. There is a need for power FETs with improved performance including lower on-resistance ($R_{DSon}$), higher blocking voltage, and lower gate charges. Sufficient ruggedness is also important, since the ruggedness defines the safe operating area (SOA) and the unclamped inductive switching (UIS) of the device. Improving these and other characteristics results in very low on-state power losses and switching losses in turn resulting in high power conversion efficiencies in applications such as DC-DC converters.

FIG. 1 is a cross sectional view of a conventional shielded gate trench MOSFET. Trench 110 includes a shield electrode 114 below a gate electrode 118. Shield electrode 114 is insulated from adjacent silicon regions by a shield dielectric 112 which is typically thicker than gate dielectric 120 extending along upper trench sidewalls. The gate and shield electrodes are insulated from one another by a dielectric layer 116 commonly referred to as inter-electrode dielectric or IED.

One problem with the shielded gate trench MOSFET shown in FIG. 1 is that gate electrode 118 typically has sharp bottom corners which with the flat top surface of shield electrode 114 leads to high electric fields in these regions. Additionally, the IED layer must be of sufficient quality and thickness to support the required voltage between the gate electrode and the shield electrode. The IED layer may be formed using various different approaches. The quality, thickness and method used to fabricate the IED dielectric are important as the IED has significant impact on electrical characteristics of the device, such as $R_{DSon}$, $Q_{gd}$, and $I_{gss}$.

Interface trap charges and oxide trap charges in IED layer 116 or at the interface between shield electrode 114 and IED 116 are associated primarily with the method for forming the IED, whether grown or deposited. If the IED dielectric layer is too thin, gate to source shorts may occur. If the dielectric is too thick, it may be difficult to align the diffused body region with the top surface of the IED region to ensure that the gate electrode extends below the bottom surface of the body region. If these two regions are misaligned, then the Qgd will decrease and the $R_{DSon}$ will increase.

Another drawback of conventional power FETs is that the drift region represents up to 40% of the total $R_{DSon}$, significantly limiting improvements in $R_{DSon}$. The deeper trenches of shielded gate trench FETs exacerbate this problem by requiring even a thicker drift region. One way to reduce the $R_{DSon}$ is to increase the trench density. This may be achieved by shrinking the cell pitch or the size of devices, to enable more FETs to be formed per square area of silicon. However, reducing the cell pitch is limited by manufacturing and design limitations, such as the minimum critical dimensions of photolithography tools and misalignment tolerances.

Misalignment tolerances may be illustrated using FIG. 1 which shows the p+ heavy body region 106 adjacent to source regions 108. Forming the heavy body and source regions requires their corresponding masks to be aligned to the trench. Misalignment of the masks during source and heavy body formation increases the $R_{DSon}$ of the device. Misalignment also increases the base resistance and the common base current gain of the parasitic BJT, which is formed by source region 108, p-type body region 104 and n-type epitaxial layer 102. A parasitic BJT could be turned on at a very low current, resulting in a poor SOA and lower UIS capability. Accordingly, masking misalignments must be minimized or eliminated in order to reduce the cell pitch and improve the performance characteristics of the power FET.

Thus, there is a need for structures and methods of forming improved shielded gate trench FET structures that eliminate or minimize the above drawbacks associated with known techniques, thus allowing improvements in the performance characteristics of shielded gate power FETs.

BRIEF SUMMARY OF THE INVENTION

A field effect transistor is formed as follows. A trench is formed in a semiconductor region. A dielectric layer lining the trench sidewalls and bottom is formed. The trench is filled with a conductive material. The conductive material is recessed into the trench to thereby form a shield electrode in a bottom portion of the trench. The recessing of the conductive material includes isotropic etching of the conductive material. An inter-electrode dielectric (IED) is formed over the recessed shield electrode.

In one embodiment, prior to the isotropic etching the conductive material is anisotropicly etched.

In another embodiment, the conductive material is anisotropicly etched before and after the isotropic etching.

In another embodiment, after the isotropic etching, the conductive material is anisotropicly etched and then isotropicly etched.

In another embodiment, a gate electrode is formed in an upper portion of the trench, the gate electrode being insulated from the shield electrode by the IED.

In another embodiment, the semiconductor region has a first conductivity type. A body region of a second conductivity type is formed in the semiconductor region. Source regions of the first conductivity type flanking the trench are formed in the body region.

In another embodiment, after recessing the conductive material, exposed portions of the dielectric layer are removed whereby the dielectric layer is recessed in the trench to below a top surface of the shield electrode. The shield electrode is recessed to below a top surface of the recessed dielectric layer.

In another embodiment, after the recessing step, exposed portions of the dielectric layer are removed whereby the dielectric layer is recessed in the trench to below a top surface of the shield electrode. The shield electrode is recessed so that a top surface of the recessed shield electrode is substantially coplanar with a top surface of the recessed dielectric layer.

A further understanding of the nature and the advantages of the invention disclosed herein may be realized by reference to the remaining portions of the specification and the attached drawings.

DETAILED DESCRIPTION OF THE INVENTION

In accordance with embodiments of the present invention, structures and methods for forming a shielded gate trench FET with an improved IED layer are disclosed. Also disclosed are structures and methods for forming shielded gate trench FETs with an improved IED layer and self aligned regions that allow the cell pitch to be reduced without increasing the process complexity. The various embodiments of the invention will be described in further detail below.

Figure 1:
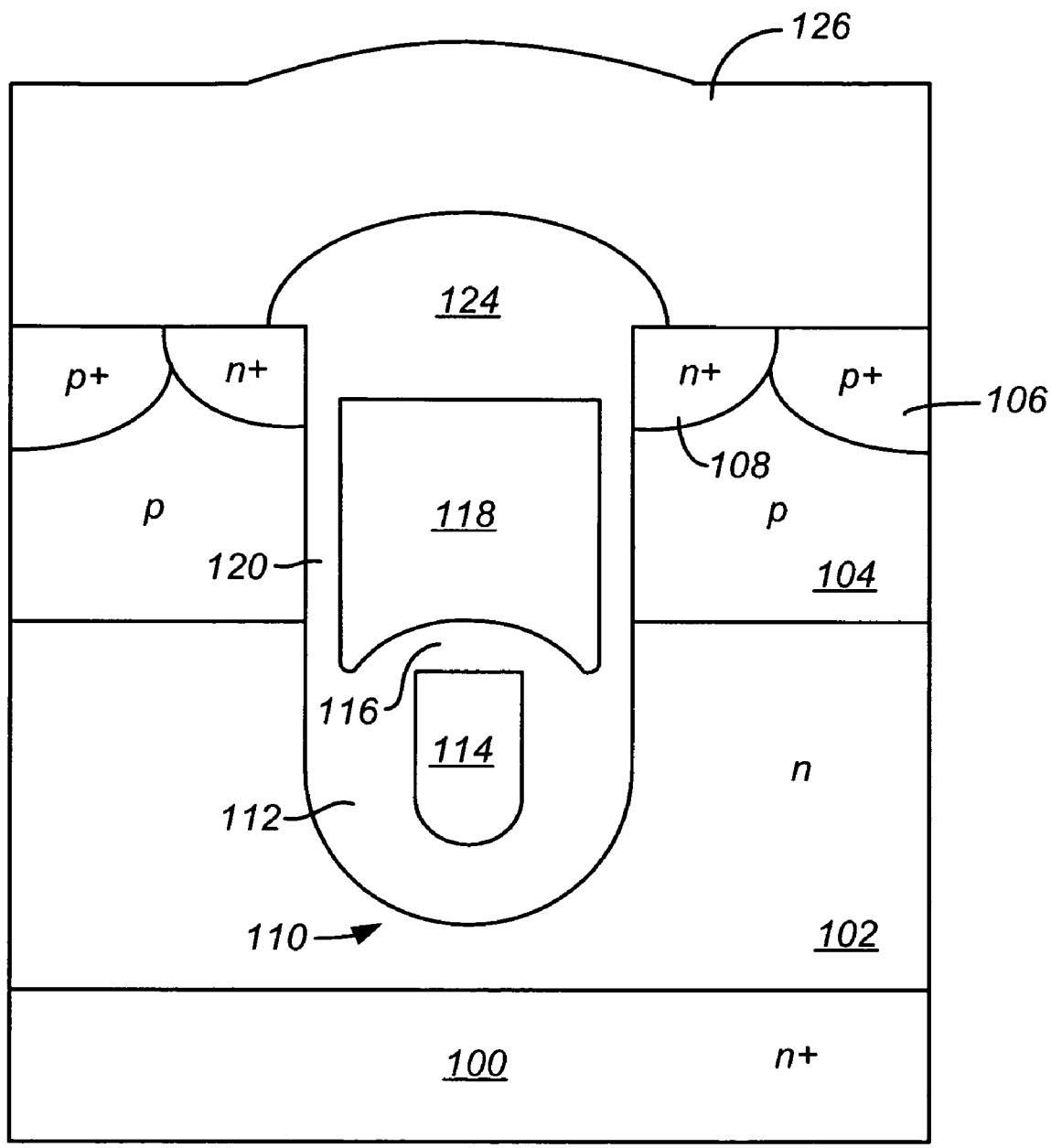
FIG. 1 is a cross sectional view of a conventional shielded gate trench MOSFET.
Figure 2:
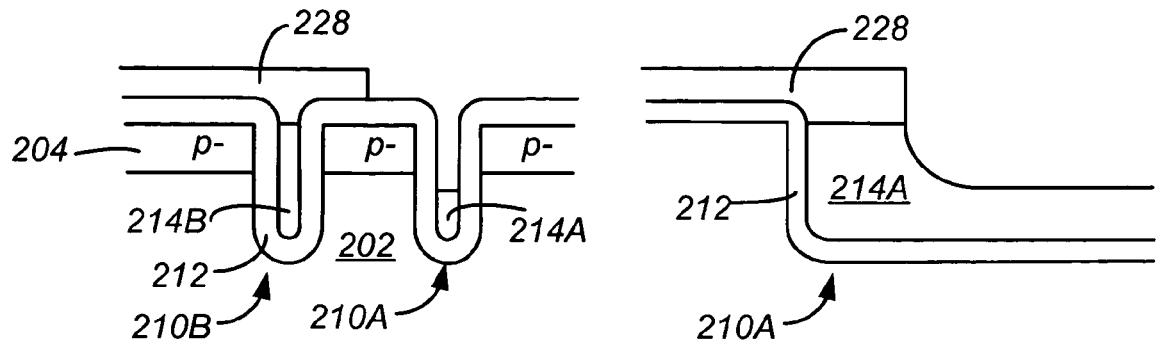
FIG. 2 shows two side-by-side cross sectional views corresponding to an intermediate process step for forming a shielded gate trench FET in accordance with one embodiment of the invention.

FIG. 2 shows two side-by-side cross sectional views corresponding to an intermediate process step for forming a shielded gate trench FET in accordance with a first embodiment of the present invention. The left diagram of FIG. 2 corresponds to a cross sectional view in the active region of the FET. The right diagram corresponds to a cross sectional view along the dimension perpendicular to the page and through the right trench in the left diagram, showing the termination of the right trench at the edge of the active region. While the cross section views in FIG. 2 correspond to a striped cell configuration, applying the same technique to close cell configurations would be obvious to one skilled in this art in view of this disclosure.

The left diagram of FIG. 2 shows a semiconductor region with p-type body region 204 formed in n-type epitaxial layer 202. Trenches 210A and 210B are formed using conventional silicon etch and patterning methods and may terminate in epitaxial layer 202 or in an n-type substrate (not shown) over which epitaxial layer 202 extends. Trench 210A represents an active trench and trench 210B can be either a termination trench or a trench used for electrically contacting the shield electrode in the active trenches. Trench 210B will hereinafter be referred to as "the termination trench."

Trenches 210A and 210B are lined with shield dielectric 212 before depositing a shield polysilicon layer filling the trenches and extending over the mesa regions. In one embodiment, shield dielectric 212 comprises oxide with a thickness in the range of 50-2000 Å or greater depending on the device break down voltage rating, and the shield polysilicon has a thickness in the range of 1,000-15,000 Å. A first shield polysilicon etch sufficient to remove the shield polysilicon from over the mesa regions is carried out. Trenches 210A, 210B remain filled with shield polysilicon. A photoresist layer 228 protects the shield polysilicon in termination trench 210B as well as a portion of the shield polysilicon at the end of the active trench (right cross section view) from a subsequent shield polysilicon etch. The shield polysilicon etch recesses all exposed shield polysilicon in active trenches 210A, thus forming shield electrodes 214A. The protected portion of shield polysilicon 214A at the end of the active trench and/or shield polysilicon 214B in the termination trench can be used to electrically contact the shield electrodes. Conventional process techniques can be used to form the IED, the gate electrode in the trench over the IED, source and heavy body regions in body region 204, dielectric cap over the gate electrode, and source, gate and drain interconnects.

In one embodiment, the etch process used for recessing the shield polysilicon into the trench is an isotropic polysilicon etch, where isotropic etching is generally understood to mean that the etch rates are the same in all directions. The isotropic shield polysilicon etch advantageously enables the formation of a more uniform IED especially with deposited oxides that are sensitive to re-entrant profiles. A more uniform IED prevents keyholes and other undesirable fill characteristics. It also eliminates sharp shield polysilicon corners and sharp corners in subsequent layers as illustrated by the smooth profile of shield polysilicon 214A in the right cross section view. Eliminating sharp corners minimizes the electric field in the regions between the shield electrode and the gate electrode. An isotropic shield polysilicon etch removes 2-D and 3-D corners in the polysilicon area, suppressing regions of thin oxide.

The isotropic etching may be advantageously combined with anisotropic etching (i.e., unidirectional etching). For example the shield polysilicon may initially be etched using the faster anisotropic etching process followed by isotropic etch to eliminate sharp corners of the shield polysilicon. Other possible variations are performing a sequence of isotropic, anisotropic, and then isotropic etching, or anisotropic, isotropic, and then anisotropic etching.

Figure 3A:
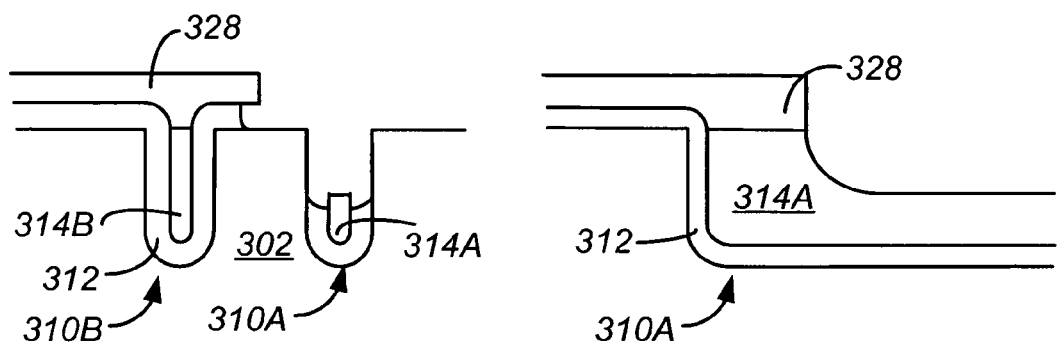
FIGS. 3A-3B show two sets of side-by-side cross sectional views corresponding to two intermediate process steps for forming a shielded gate trench FET in accordance with another embodiment of the invention.
Figure 3B:
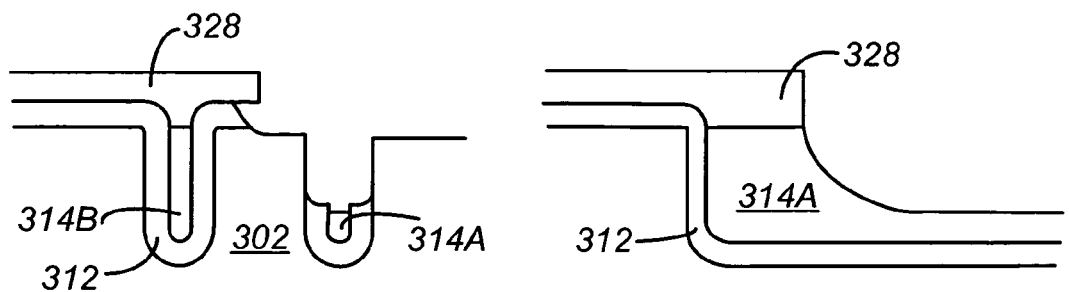

FIGS. 3A and 3B show two sets of side-by-side cross sectional views corresponding to two intermediate process steps for forming a shielded gate trench FET in accordance with a second embodiment of the present invention. This method can be used with standard processing or in conjunction with the method of the first embodiment of FIG. 2. An objective of this method is to have the shield polysilicon be co-planar or recessed below the shield oxide remaining after the shield oxide etch. Thus, when the IED layer is formed on the shield polysilicon, the IED material will have less topography which in turn enables formation of a gate electrode with a planar bottom surface. Accordingly, problems of fill and electrical stress at sharp corners are reduced, if not eliminated.

Similar steps to those described above in connection with FIG. 2 are carried out. Trenches 310A, 310B, shield electrodes 314A, 314B, shield dielectric 312, and photoresist layer 328 in FIG. 3A correspond to trenches 210A, 210B, shield electrodes 214A, 214B, shield dielectric 212, and photoresist layer 228 in FIG. 2, respectively. In FIG. 3A, the exposed portions of shield dielectric 312 are recessed below the top surface of shield electrode 314A using conventional dielectric etch techniques.

In FIG. 3B, shield electrode 314A is then etched again to be co-planar with or below the top surface remaining shield dielectric 312. This prevents formation of sharp corners in the later formed gate electrode which minimizes electric fields between the shield and gate electrodes. The embodiment where the shield electrode 314A is etched below the top surface of shield dielectric 312 is particularly advantageous because the smaller shield electrode results in smaller source capacitance which in turn improves the device switching performance.

The second shield electrode etch likely removes silicon from the mesa and other exposed silicon regions, including the upper sidewalls of the trench. This can be favorable if controlled for shaping trenches (sloped) for gate electrode filling. Known silicon surface recovery processes (e.g., anneal) can be used to remove any silicon damage caused by the second shield electrode etch. After the steps corresponding to FIG. 3B, the IED, gate dielectric, gate electrode, source regions, heavy body regions, various interconnect layers as well as other structural elements of a FET are formed using known techniques.

Figure 4A:
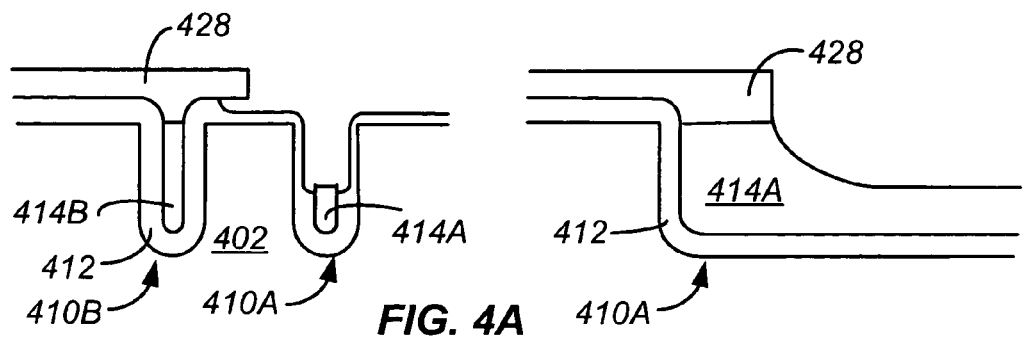
FIGS. 4A and 4B show two sets of side-by-side cross sectional views corresponding to two intermediate process steps for forming a shielded gate trench FET in accordance with another embodiment of the present invention.
Figure 4B:
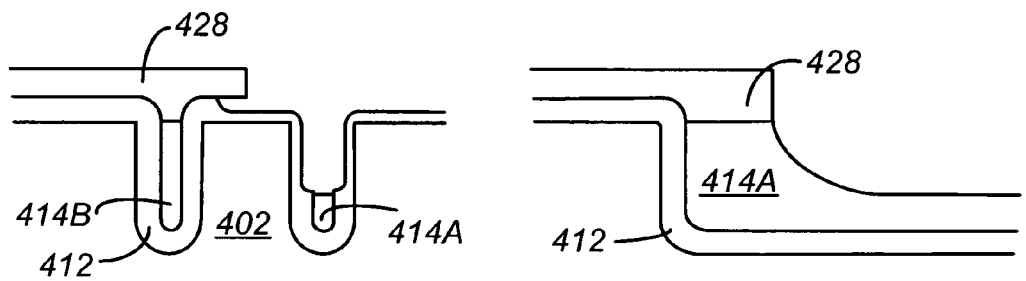

FIGS. 4A and 4B show two sets of side-by-side cross sectional views corresponding to two intermediate process steps for forming a shielded gate trench FET in accordance with a third embodiment of the present invention. This embodiment is a variation of the second embodiment in FIGS. 3A and 3B, with additional steps taken to protect or minimize etching of the mesa and the channel region during the second shield electrode etch. Similar steps to those described above in connection with FIG. 2 are carried out. Trenches 410A, 410B, shield electrodes 414A, 414B, shield dielectric 412, and photoresist layer 428 in FIG. 4A correspond to trenches 210A, 210B, shield electrodes 214A, 214B, shield dielectric 212, and photoresist layer 228 in FIG. 2, respectively.

In FIG. 4A, after forming shield electrode 414A, the exposed portions of shield dielectric 412 are partially removed to, in effect, form a "pad" oxide (e.g., about 400 Å thick) to prevent the silicon etching during the second etch of the shield electrode. This shield dielectric etch can be targeted to be used as a pad oxide for LOCOS (local oxidation of silicon) IED formation described in the commonly assigned patent application Ser. No. 11/026,276, titled "Power Semiconductor Devices and Methods of Manufacture," incorporated herein by reference in its entirety.

In FIG. 4B, the second shield electrode etch is carried out to recess shield electrode 414A to about the same level or just below a recessed surface of shield dielectric 412 in the trench adjacent shield electrode 414A. The IED, gate dielectric, gate electrode, source regions, heavy body regions, various interconnect layers as well as other structural elements of a FET are formed using known techniques.

FIGS. 5A-5H show eight sets of side-by-side cross sectional views corresponding to process steps for forming a shielded gate trench FET in accordance with a fourth embodiment of the present invention. In this embodiment various techniques from the first, second and third embodiment are combined including use of the LOCOS technique to form the IED. Use of this technique eliminates nitride stringers which may form on the shield electrode, especially where the shield polysilicon is brought to the surface of the trench for electrical contact.

An example of this hybrid approach is to couple the isotropic shield polysilicon etch described above with the LOCOS method described in the above-referenced U.S. patent application Ser. No. 11/026,276. Another example is to combine the isotropic shield polysilicon etch technique described above with the partial shield dielectric etch for forming the "pad oxide" as described above, together with the LOCOS IED method described in the above-referenced U.S. patent application Ser. No. 11/026,276.

Figure 5A:
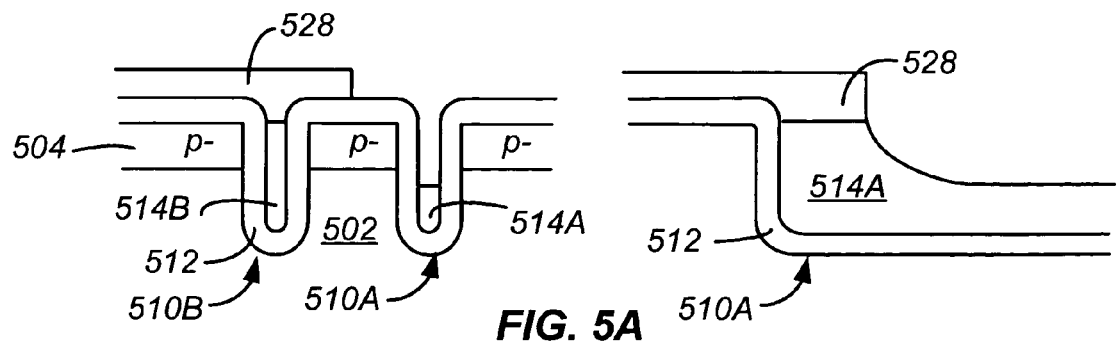
FIGS. 5A-5H show eight sets of side-by-side cross sectional views corresponding to process steps for forming a shielded gate trench FET in accordance with another embodiment of the invention.
Figure 5B:
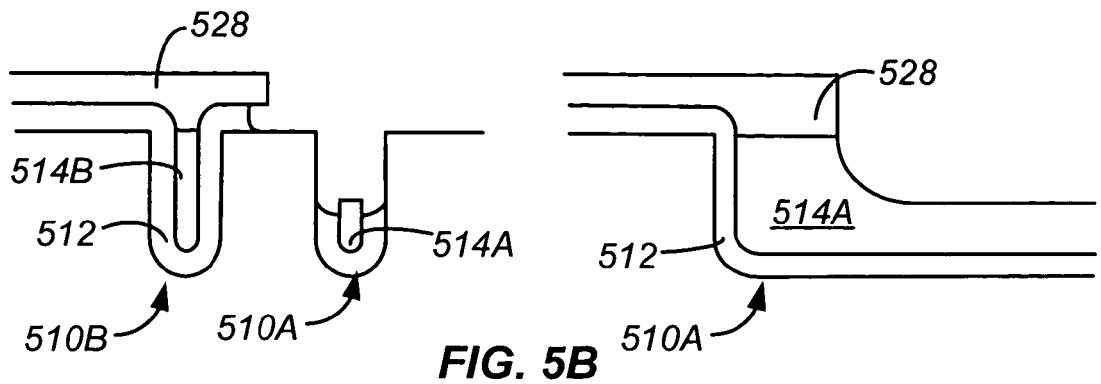
Figure 5C:
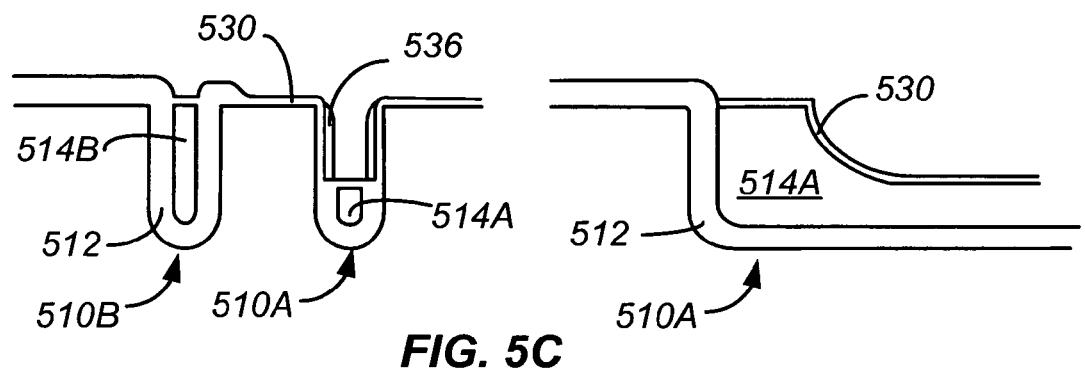

FIGS. 5A-5G illustrate an example of one of such hybrid embodiments. FIGS. 5A and 5B correspond respectively to FIGS. 2 and 3A, and thus will not be described. In FIG. 5C, shield electrodes 514A in trenches 510A are recessed to the same level or below the surface of shield dielectric layer 512 recessed in trench 510A. Photoresist layer 528 is removed and then a pad oxide layer 530 is formed along all exposed silicon surfaces, using known techniques. An alternative approach would be to use the technique in FIGS. 4A and 4B where the shield dielectric is thinned down, leaving a "pad oxide" layer behind. Nitride spacers 536 are then formed along the trench sidewalls using conventional techniques.

Figure 5D:
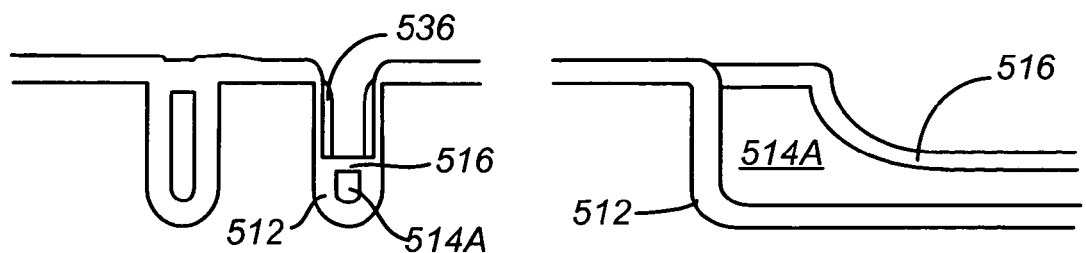
Figure 5E:
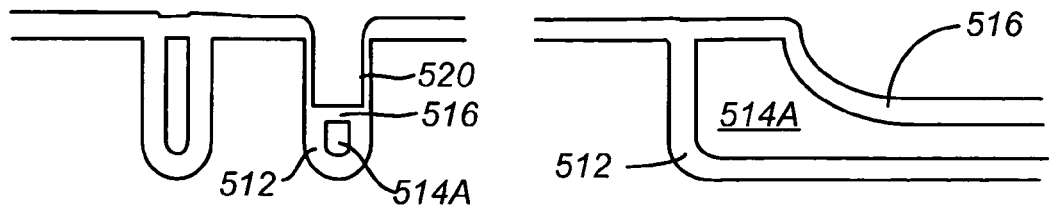

In FIG. 5D, IED 516 is formed using a conventional oxidation process. In FIG. 5E, nitride spacers 536 and their underlying pad oxide are removed to expose the silicon along upper trench sidewalls, using known techniques. A gate dielectric 520 (e.g., comprising oxide) is then formed. In one embodiment, in FIG. 5B, instead of completely removing exposed portions of the shield dielectric, the technique in FIGS. 4A and 4B where the exposed shield dielectric is thinned is used where the thinned down portions of the shield dielectric extending along the upper trench sidewalls serve as the gate dielectric. However, a cleaning process is required to improve the quality of the thinned down shield dielectric. This would eliminate the steps in FIG. 5E for forming gate dielectric as well as the steps in FIG. 5C for forming pad oxide 530.

Figure 5F:
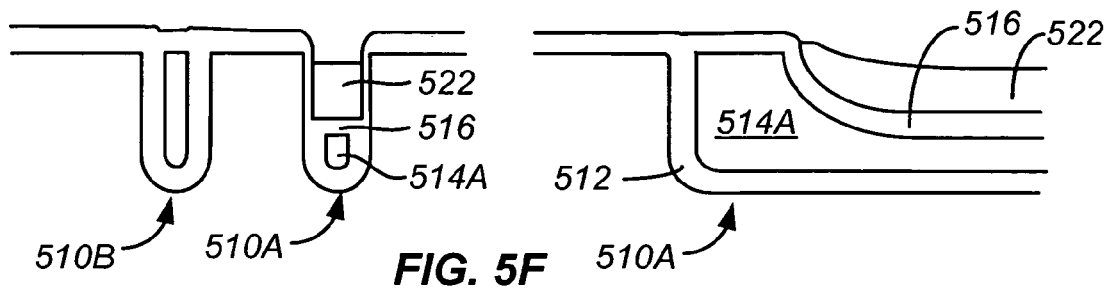
Figure 5G:
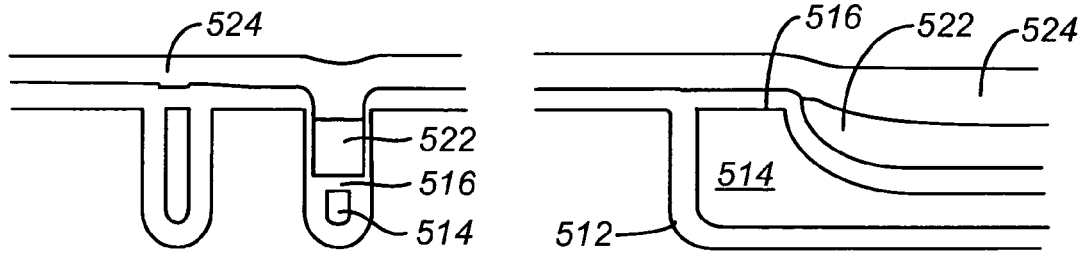
Figure 5H:
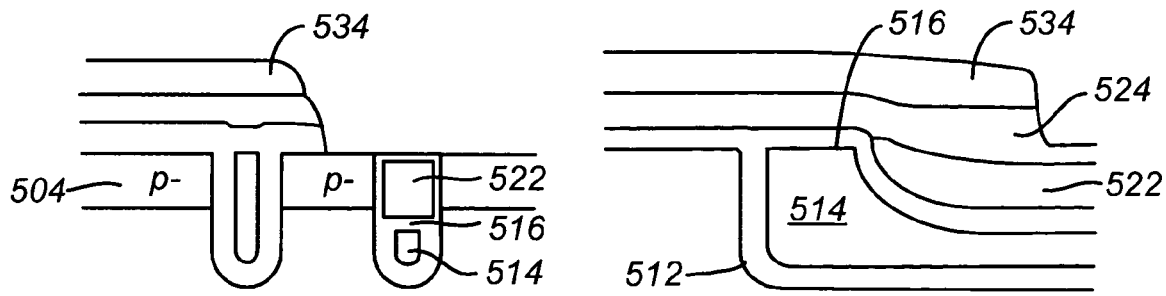

In FIG. 5F, a gate electrode 522 (e.g., comprising polysilicon) is formed in trenches 510A and recessed to just below the mesa using conventional techniques. In FIG. 5G a dielectric layer 524 (e.g., comprising BPSG) is formed. In FIG. 5H, dielectric layer 524 along with its underlying IED layer 516 are selectively removed using a masking layer 534. The source and heavy body regions, the various interconnect layers, as well as other structural elements of the FET are formed using known techniques. These structural elements may be formed at various stages of the process such as before or after the process steps corresponding to FIG. 5H.

In accordance with other embodiments of the present invention, one of a number of techniques may be used to minimize the oxide charges, reduce gate-to-source shorts and control the oxide growth rate using multiple ambient oxidation. In the conventional method, a thick IED is obtained by thermal oxidation using a steam ambient which provides a differential oxidation rate between silicon crystal and polycrystalline. However, this IED has several drawbacks including trap charge issues and growth rate control problems. To address these problems, in one embodiment of the invention a portion of the IED is grown using a steam ambient, followed by another oxidation step in a dry ambient to anneal the oxide charges and control the final oxide thickness. The oxidation in the dry ambient is performed at a higher temperature than in the steam ambient oxidation, to aid in annealing the oxide charges.

In a variation of the above method, the second oxidation step is replaced with an anneal at a higher temperature in an inert ambient, such as nitrogen or argon, which will also serve to anneal the charges. In yet another variation according to another embodiment of the invention, the IED is formed using three steps: a steam ambient oxidation, a dry ambient oxidation, and then an inert anneal. For any of these techniques, the dry ambient oxidation could be carried out at equal or higher temperatures than the steam ambient oxidation.

In yet another embodiment for forming the IED, an initial oxide layer may be formed by high density plasma (HDP) oxide or by sub-atmospheric chemical vapor deposition (SACVD), followed by a dry ambient oxidation. An inert anneal may optionally be carried out after the dry ambient oxidation. In one variation, after depositing the initial oxide layer and before the dry ambient oxidation, a steam ambient oxidation is carried out.

Figure 6:
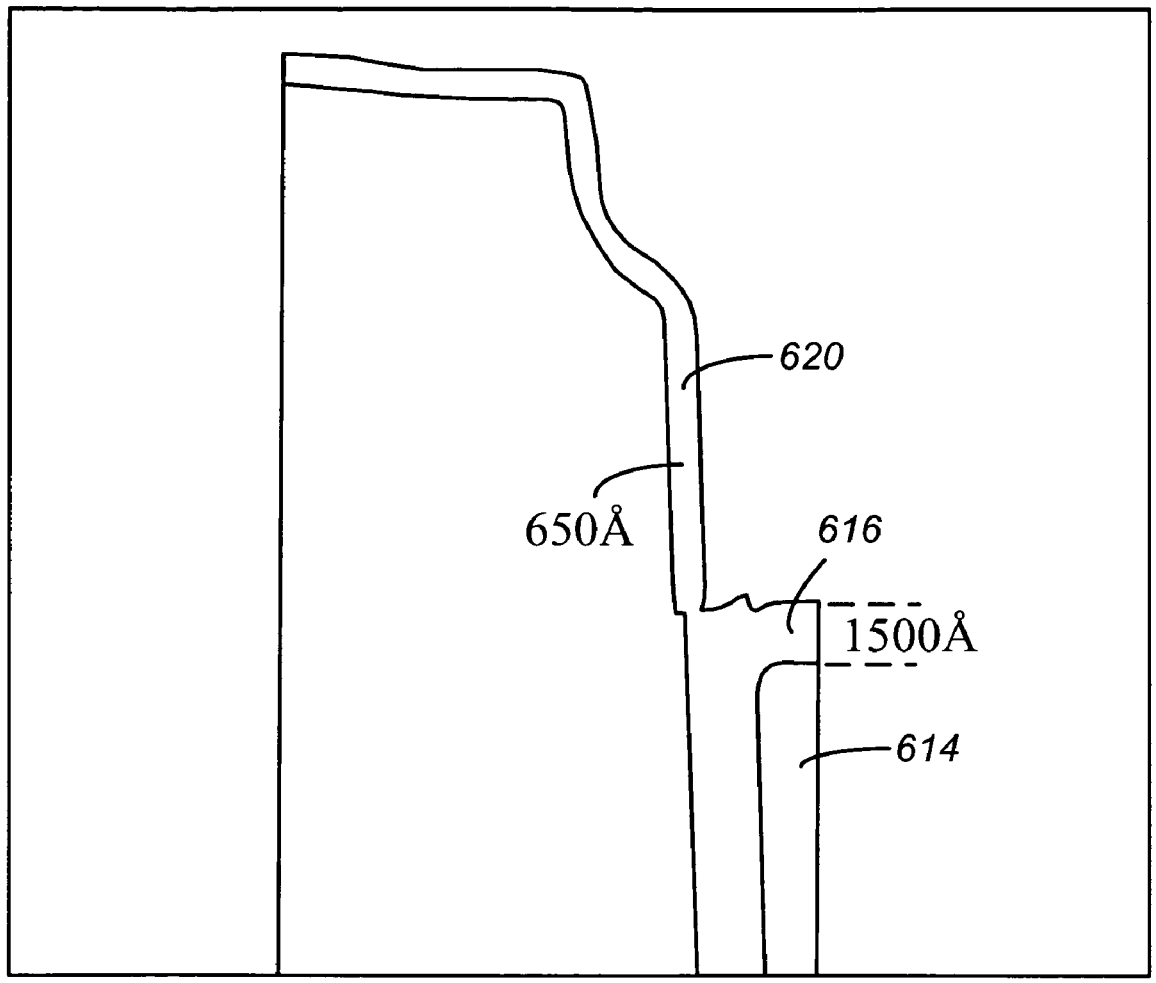
FIG. 6 is the results from a simulation showing a partial cross sectional view of an exemplary shielded gate structure formed in accordance with an embodiment of the present invention.

FIG. 6 is the results from a simulation showing a partial cross sectional view of an exemplary shielded gate structure formed in accordance with an embodiment of the present invention. As shown, the present technique of combining the steam ambient oxidation with an additional dry ambient oxidation and/or an inert ambient anneal can be used to form an IED layer 616 of about 1500 Å, where a gate oxide of about 650 Å thick is subsequently formed.

The above methods for formation of an improved IED layer may be combined with any of the methods for forming self-aligned shielded gate trench MOSFET structures described next.

The following methods according to embodiments of the invention provide a high density power FET with source and heavy body contact regions that are formed in a self-aligned manner. Self-alignment of these features improves the performance of power FETs because the minimum cell pitch is not limited by source/heavy body masking misalignment tolerances. Self-alignment may be either horizontal (e.g., self-alignment of source contacts, or heavy body contacts), or vertical (e.g., self-alignment of the source and/or body regions to the gate electrode), or both. Self-alignment also allows the device to be formed with a lower mask count and therefore lower manufacturing cost. FIGS. 7-11 illustrate various process flows for forming self-aligned shielded gate structures.

Figure 7:
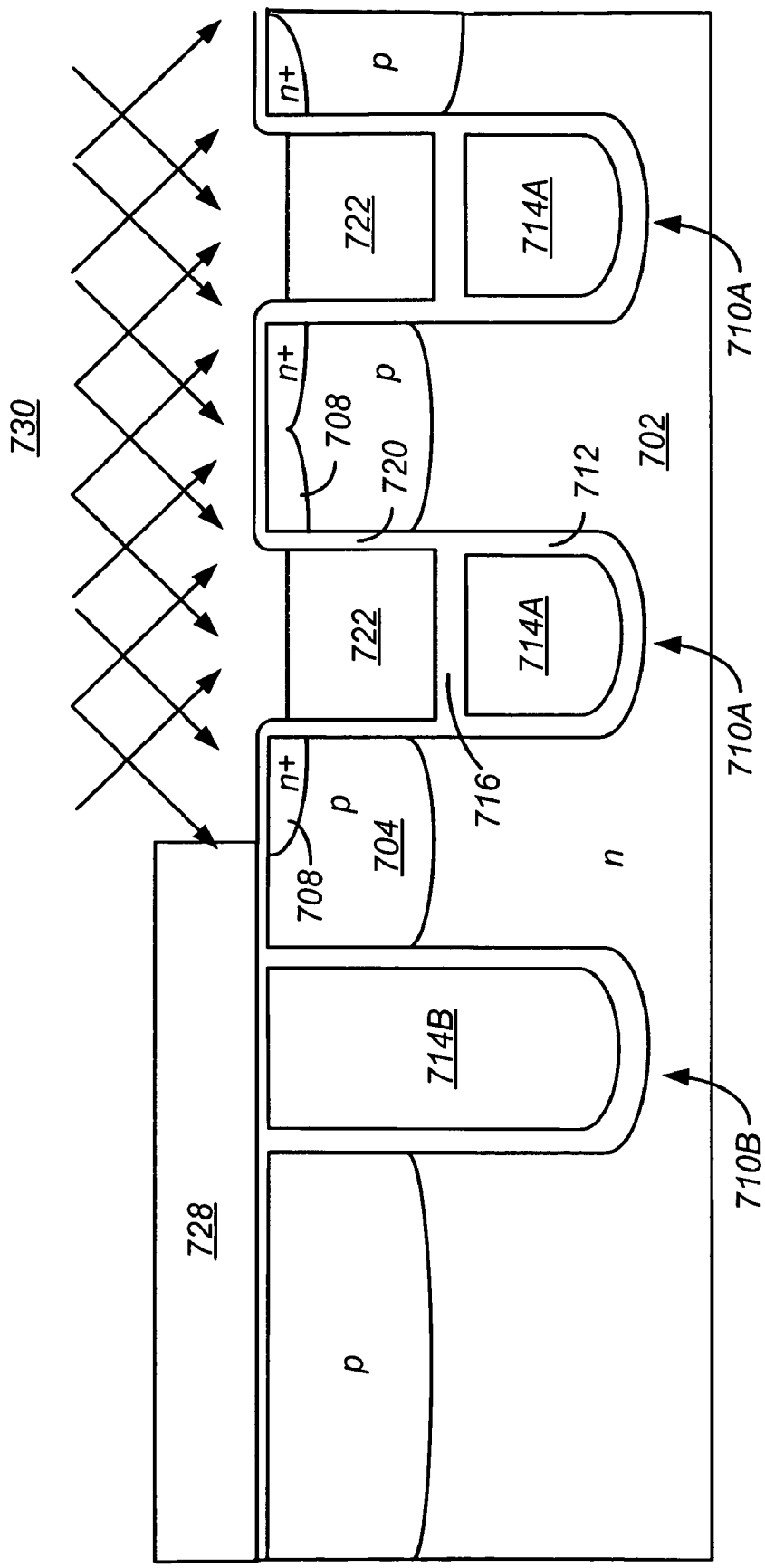
FIG. 7 is a cross sectional view corresponding to an intermediate process step for forming a shielded gate FET wherein source regions are formed using a dual-pass angled implant, in accordance with an embodiment of the invention.

The source regions may be formed in various ways. In some embodiments of the invention, the source regions are formed by conventional blanket implantation of n-type dopants. In other embodiments of the invention, an angled implantation process may be used so that the dopant impurities hit the surface of the silicon at an angle. FIG. 7 shows a simplified cross sectional view depicting the angled implantation process. Angled implantation is typically a dual-pass method and is performed twice as shown by the arrows 730 in FIG. 7. A masking layer 728 (e.g., comprising photoresist) is formed on top of the mesa in the edge area of the die (shown on the left side of FIG. 7) to prevent the source implant from entering the edge area. The edge area, in this embodiment, includes a shield termination trench 710.

Active trenches 710A include shield electrode 714A insulated from surrounding silicon by shield dielectric layer 712. Gate electrode 722 in each trench is over but insulated from shield electrode 714A an inter-electrode dielectric IED 716. P-type body regions 704 are formed in n-type semiconductor region 702.

In conventional methods, the implant energy and thermal cycle determine the source region's junction depth. However, in exemplary embodiments of the present invention, the implantation angle is a significant factor in determining the source depth. The benefit of the angled implant is to provide a differential depth across the mesa with the regions closest to the sidewall of the trench having the deepest depth, and regions toward the center of the mesa having the shallowest depth. Thus, source regions 708 may be vertically self-aligned to gate electrodes 722, as shown in FIG. 7. Self-aligned source regions then permit the heavy body regions to be horizontally self-aligned when they are formed in subsequent processing steps.

Figure 8A:
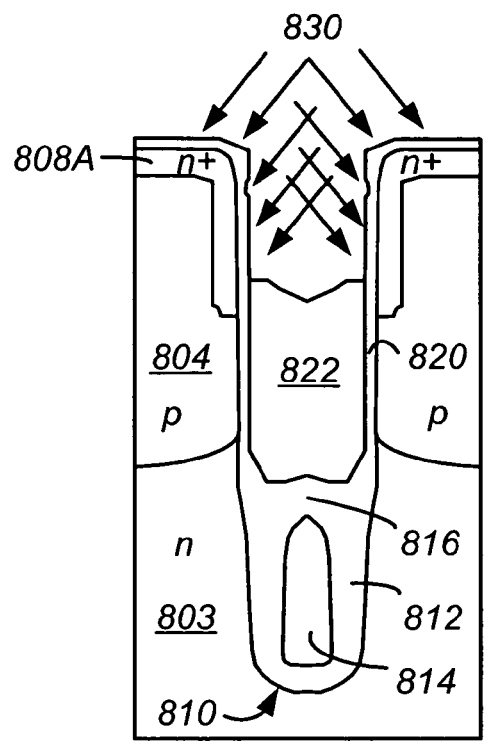
FIGS. 8A-8F show simplified cross sectional views depicting an exemplary process flow for forming a self-aligned shielded gate trench FET, in accordance with an embodiment of the invention.

FIGS. 8A-8F show simplified cross sectional views depicting an exemplary process flow for forming a self-aligned shielded gate trench FET that utilizes angled implantation. In FIG. 8A, the shielded gate structure which includes shield electrode 814 along the trench bottom, gate electrode 822 in an upper trench portion, and an IED 816 insulating the gate and shield electrodes, as well as shield dielectric 812 lining lower trench sidewalls and bottom and gate dielectric 820 lining upper trench sidewalls are formed in accordance with conventional techniques or one or a combination of the process techniques described above. In one embodiment, IED layer 816 is formed by any of the methods described or referenced above. The gate polysilicon is recessed below the top surface of the mesa in order to expose upper sidewalls to subsequent angled source implant.

Figure 8B:
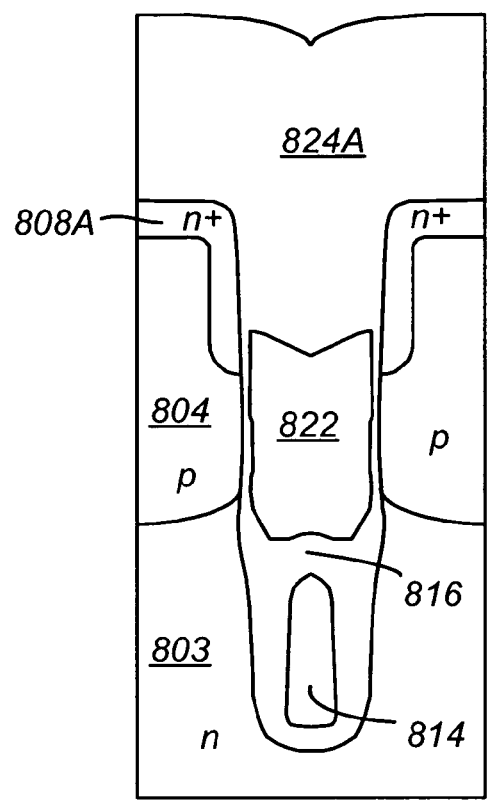

Dual angled source implants 830 are carried out to form heavily doped n-type regions 808A along the exposed upper trench sidewalls and the mesa surfaces. This will lead to formation of source regions 808B which are vertically self-aligned with the recessed gate electrode 822. In FIG. 8B, a dielectric layer 824A, such as BPSG, filling trench 810 and extending over the mesa is formed using known techniques.

Figure 8C:
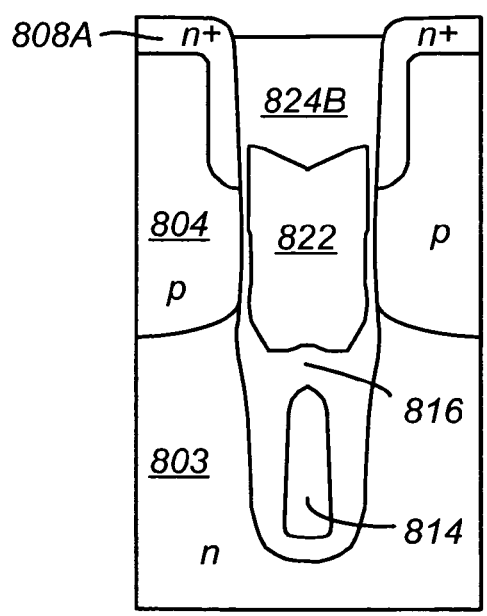

In FIG. 8C, dielectric layer 824A is then planarized to the silicon mesa thereby removing portions extending over the mesa surfaces. Thus, dielectric portion 824B remains in trench 810. Conventional CMP or dielectric etching with silicon as the etch stop may be used. A slight over-etch of the dielectric material may be carried out to ensure that dielectric material 824A is completely removed from over the mesa surfaces so that a subsequent mesa recess can be carried out.

Figure 8D:
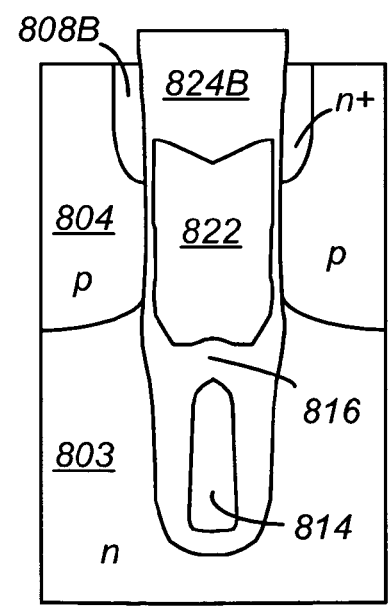
Figure 8E:
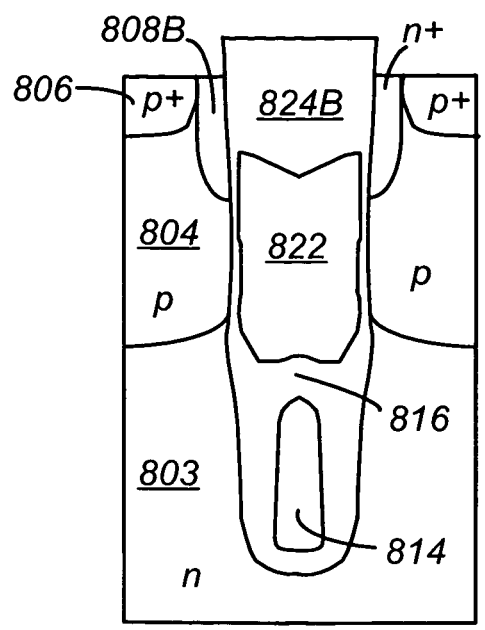
Figure 8F:
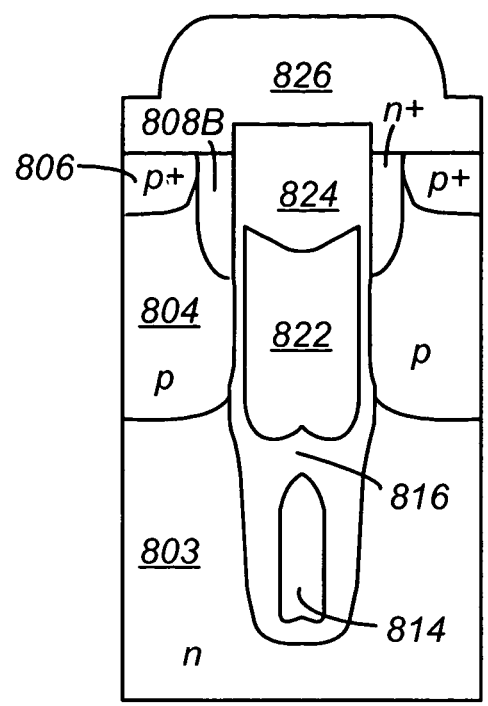

In FIG. 8D, the silicon mesa is recessed sufficiently to remove the laterally extending portion of n-type region 808A. The silicon recess leaves discrete, horizontally aligned source regions 808B, which provide boundaries to form self-aligned p+ heavy body regions in subsequent steps. In FIG. 8E, p-type heavy body regions 806 are formed by implanting p-type dopants such as boron into body region 804. A thermal anneal step follows the heavy body implantation. In FIG. 8F, a source interconnect layer 826 is formed over the structure to contact the source and heavy body regions.

In one embodiment, no mask is used during the heavy body implant step whereby the heavy body implant also enters source regions 808B. However, the higher doping concentration of source regions 808B ensures that the p-type heavy body implant does not counter-dope the source regions so as to convert the source regions to p-type. For example, in one embodiment, dopants to form heavy body regions 806 have a concentration of typically $2\times10^{15}$ to about $5\times10^{9}$ and the n-type source regions 808 are formed with dopants having a concentration typically ranging from $1\times10^{19}$ to about $1\times10^{20}$.

In another embodiment, dielectric spacers may be formed along the exposed walls of the dielectric material 824B in FIG. 8D after the silicon etch, so that the spacers are positioned directly over source regions 808B. Consequently, source regions 808B are completely shielded from any encroachment of p+ dopants of the heavy body implant. This approach would minimize the encroachment of p+ dopant into the channel region and thus improve the $R_{DSon}$ and maintain control of the threshold voltage.

In one variation of the spacer technique, n-doped polysilicon spacers are formed instead of dielectric spacers. The n-doped polysilicon spacers serve as an extension of source regions 808B. The advantages of using polysilicon spacers are described in more detail further below. In yet other variations of the spacer technique, after forming the dielectric or polysilicon spacers, the mesa region defined by the opening between adjacent spacers is further recessed prior to heavy body implant. This advantageously drives the subsequently formed heavy body region even deeper into body region 804.

Figure 9A:
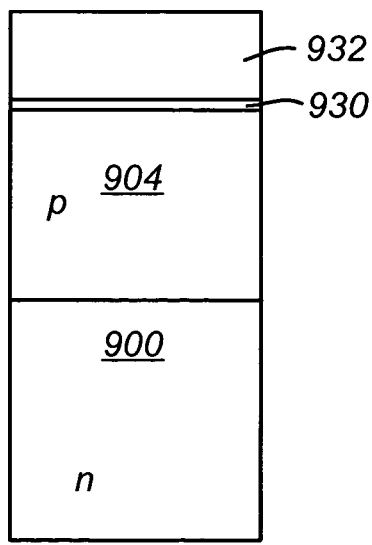
FIGS. 9A-9J are simplified cross sectional views depicting another process flow for forming a self-aligned shielded gate trench FET in accordance with an embodiment of the invention.

FIGS. 9A-9J are simplified cross sectional views depicting another process flow for forming a self-aligned shielded gate trench FET in accordance with another embodiment of the invention. In FIG. 9A, a hard mask comprising a pad oxide 930 and a thick nitride layer 932 over the pad oxide is formed over a p-type body region 904 extending over a n-type drift region 900. The bi-layer hard mask is not limited to pad oxide and nitride, and may comprise any two materials that are opposite or highly different in selectivity. Also, body region 904 may be formed in later stages of the process.

Figure 9B:
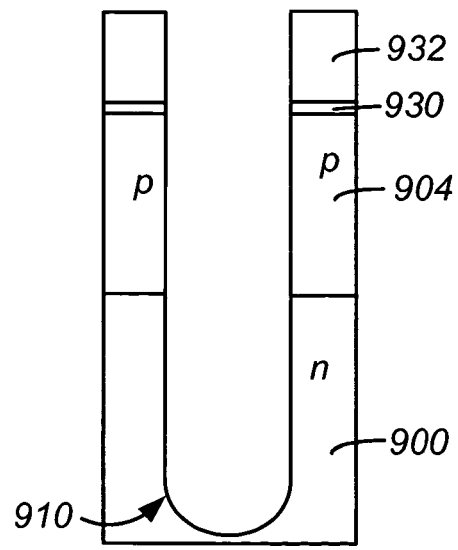
Figure 9C:
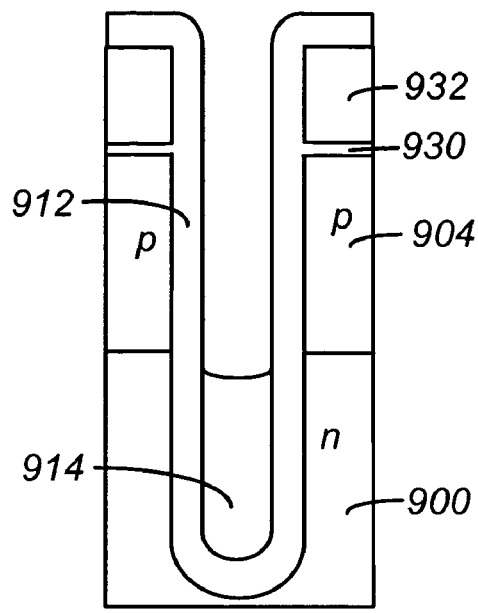

In FIG. 9B, the hard mask is patterned and etched, followed by a conventional silicon etch to form trench 910 extending through the underlying silicon. Trench 910 may terminate in a highly-doped n-type substrate (not shown) extending directly below drift region 900, or terminate in drift region 900 as shown. In FIG. 9C, a shield dielectric 912 (e.g. comprising oxide) lining the trench sidewalls and bottom is formed, followed by formation of shield electrode 914 using conventional techniques.

Figure 9D:
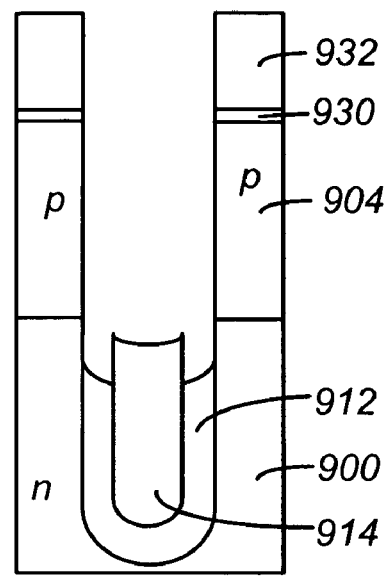
Figure 9E:
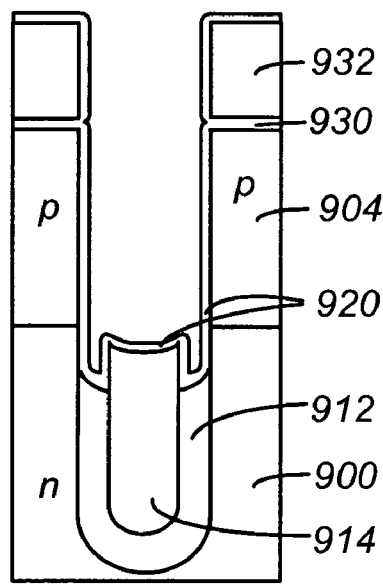

In FIG. 9D, the exposed portions of shield dielectric 912 are etched. This will cause shield dielectric layer inside the trench to recess below a top surface of shield electrode 914. In FIG. 9E, an oxidation of silicon is carried out to form the gate dielectric along the upper trench sidewalls and the IED layer. In other embodiments, instead of the oxidation of silicon, any of the various methods for forming the IED described above or incorporated herein by reference may be used to from the IED, followed by gate oxidation to form the gate dielectric.

Figure 9F:
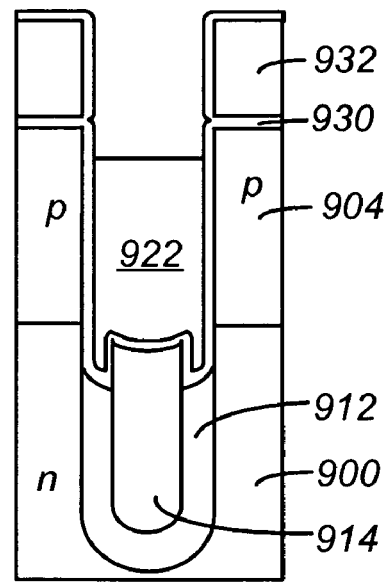
Figure 9G:
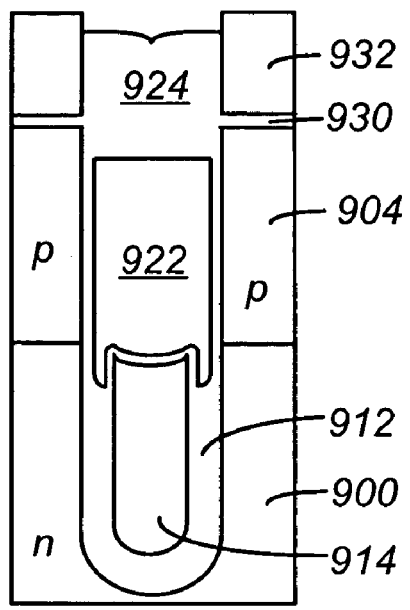
Figure 9H:
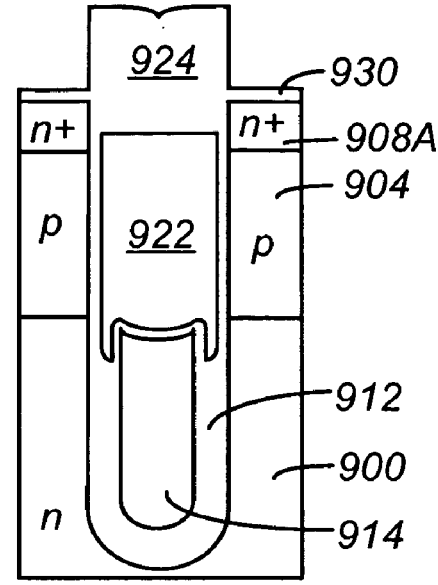

In FIG. 9F, after IED/gate dielectric 920 is formed, gate electrode 922 is formed by for example, depositing polysilicon and recessing it into trench 910 below the silicon mesa surface. In FIG. 9G, a dielectric material 924 such as BPSG is deposited and planarized to just below the surface of nitride layer 932 of the hard mask. In FIG. 9H, nitride layer 932 of the hard mask is removed using for example selective etch. Highly doped n-type regions 908A are then formed using a blanket source implant in the active region. Alternatively, a dual-pass angled implant could be performed along trench upper sidewalls to form highly doped n-type regions 908A. In FIG. 9H, dielectric pillar 924 provides vertical walls against which spacers for self alignment of the heavy body region can next be formed.

Figure 9I:
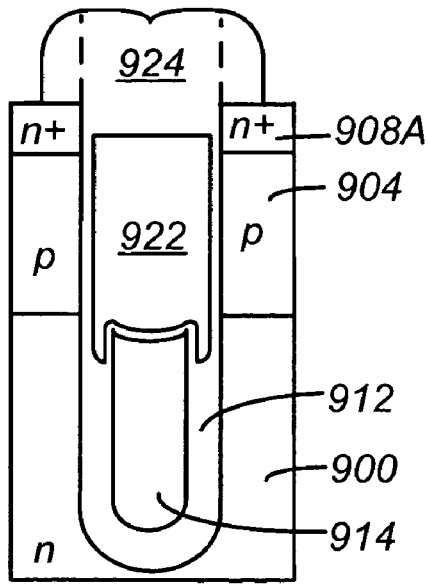
Figure 9J:
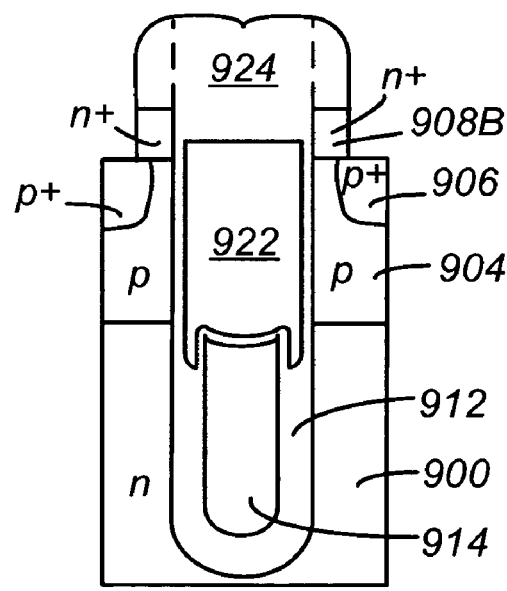

In FIG. 9I, either spacers can be formed over n+ regions 908A adjacent dielectric material 924, or the BPSG flow properties can be used to extend BPSG layer 924 over n+ regions 924. Any kind of dielectric may be used as dielectric material 924, such as nitride, oxide, or polysilicon, so long as it is deposited in a conformal manner. In FIG. 9J, the exposed silicon mesa surfaces are then recessed to a depth equal to or below a bottom surface of n+ region 908A. Those portions of n+ regions 908A protected from the silicon recess by the spacers or the reflowed BPSG form source regions 908B. This may be done by low temperature oxidation (LPO), plasma etching, or other methods.

Typically, silicon etch would etch right through any residual oxides on the surface of the mesa formed from the gate oxidation step. However, an additional dielectric etch may be necessary to clean the surface of the mesa prior to carrying out heavy body implant. In FIG. 9J, a heavy body implant is carried out to form p+ heavy body regions 906. Since the reflowed BPSG dielectric 924, or alternatively the spacers formed off the BPSG dielectric 924, covers source regions 908B, the source regions are not counter-doped with the heavy body dopants. Consequently, heavy body regions 906 are self aligned and kept out of the channel regions. Moreover, forming heavy body regions into a recessed silicon region provides the additional advantage of pushing the heavy body regions deeper into the body region. This decreases the common base current gain and helps improve device ruggedness, such as increasing the safe operating range (SOA), and increasing the unclamped inductive switching (UIS) of the power MOSFET.

In an alternative embodiment of the above process, the silicon etch in FIG. 9J is not carried out, and instead heavy body regions are formed by implanting a high dose of p-type dopants into exposed portions of n+ region 908A in FIG. 9I, thus counter-doping the exposed portions of n+ regions 908A.

Figure 10A:
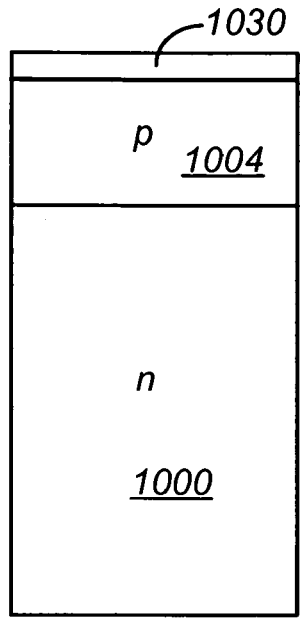
FIGS. 10A-10P are simplified cross sectional views depicting a process flow for forming a self-aligned shielded gate trench FET in accordance with yet another embodiment of the invention.
Figure 10B:
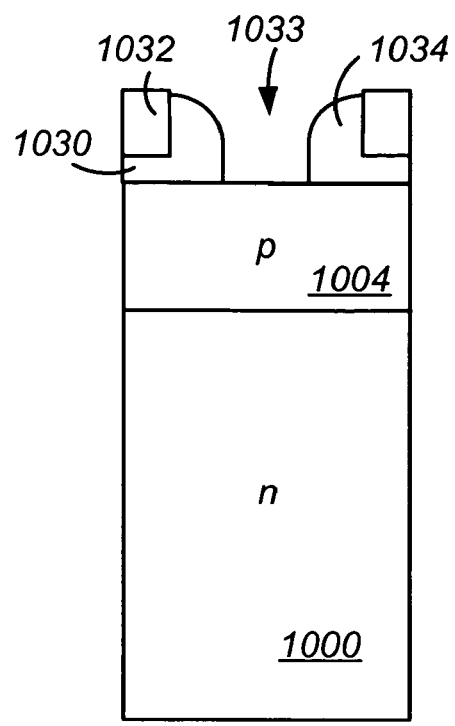
Figure 10C:
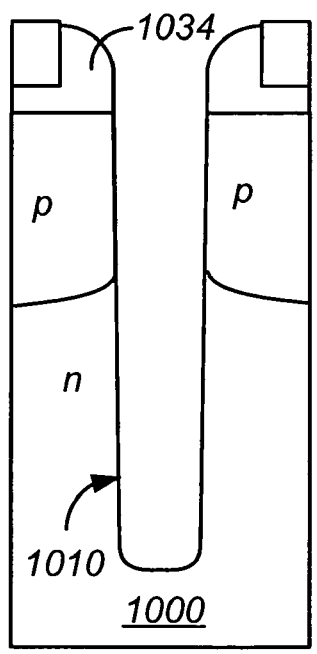
Figure 10D:
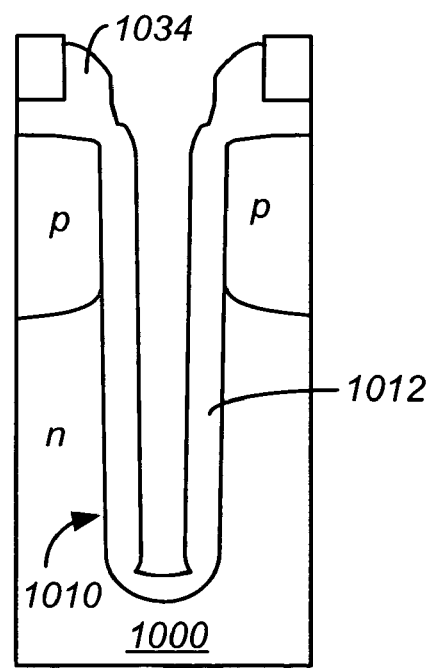
Figure 10E:
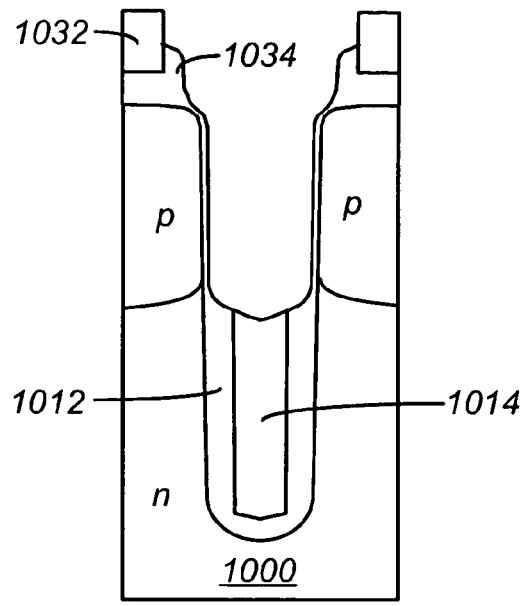
Figure 10F:
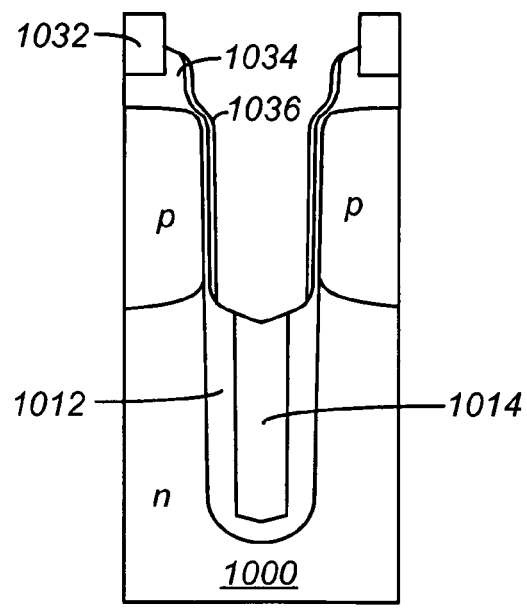
Figure 10G:
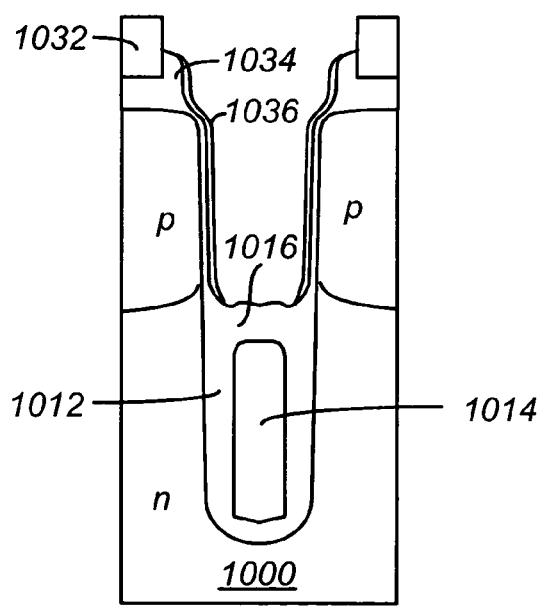
Figure 10H:
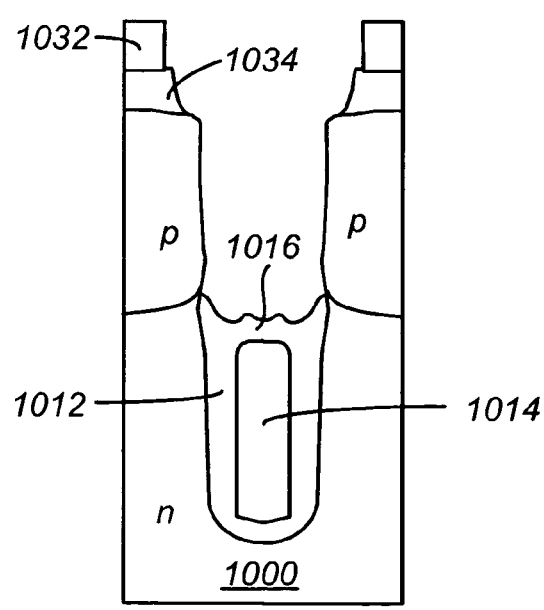
Figure 10I:
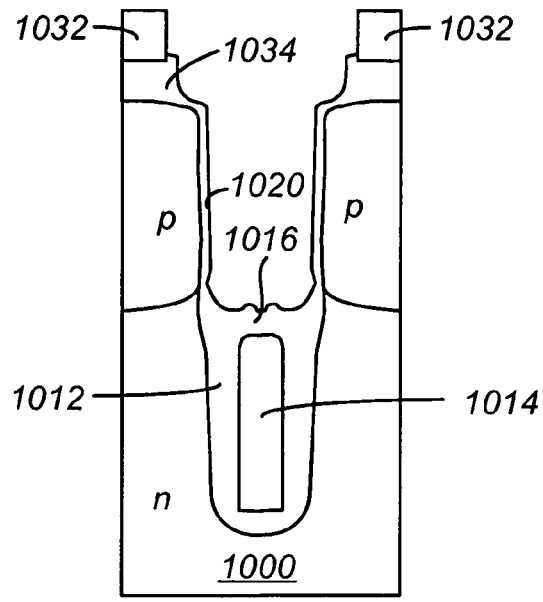
Figure 10J:
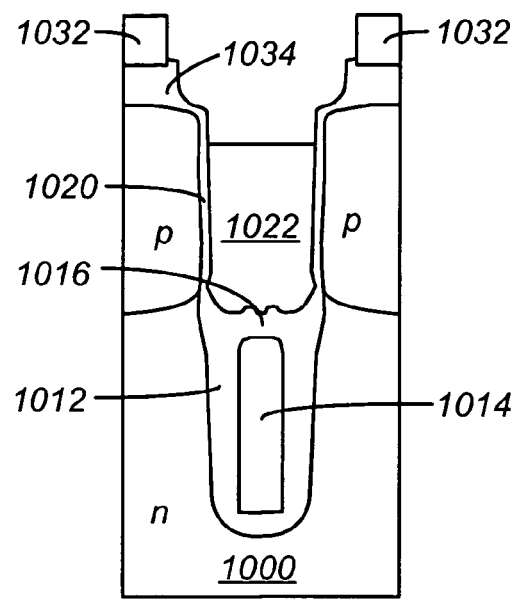
Figure 10K:
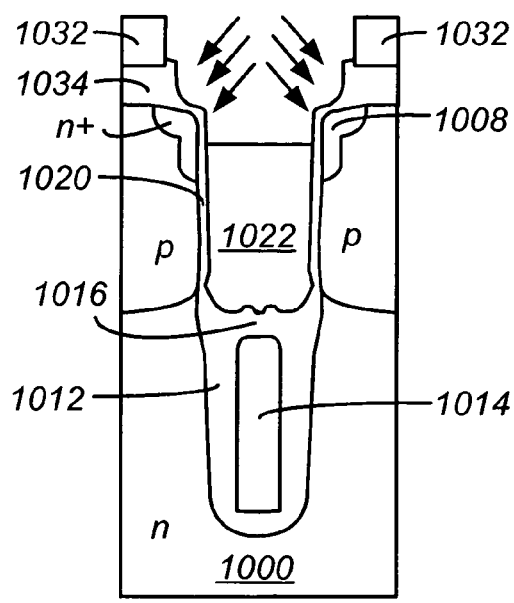
Figure 10L:
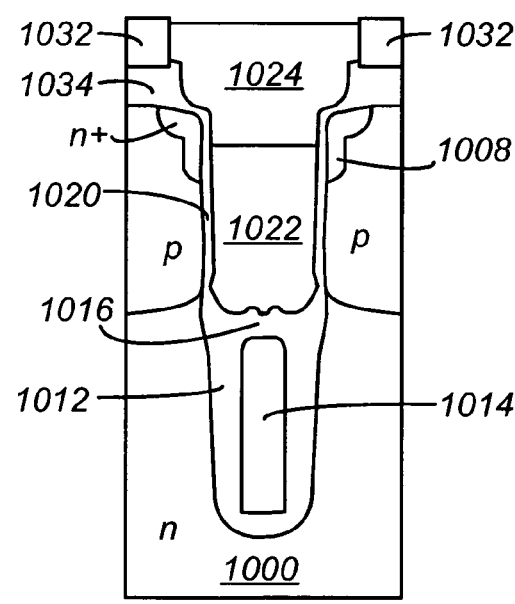
Figure 10M:
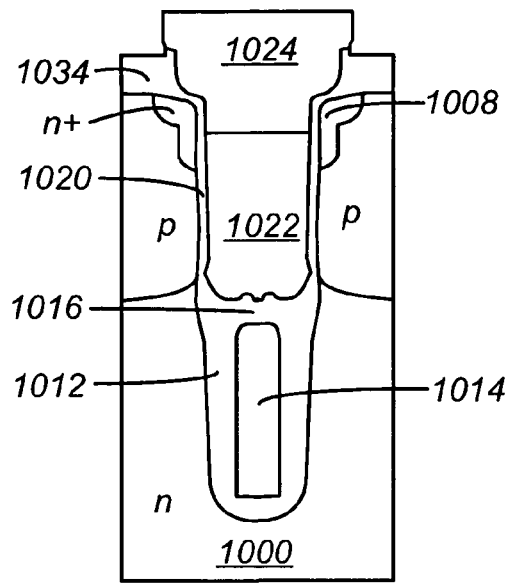
Figure 10N:
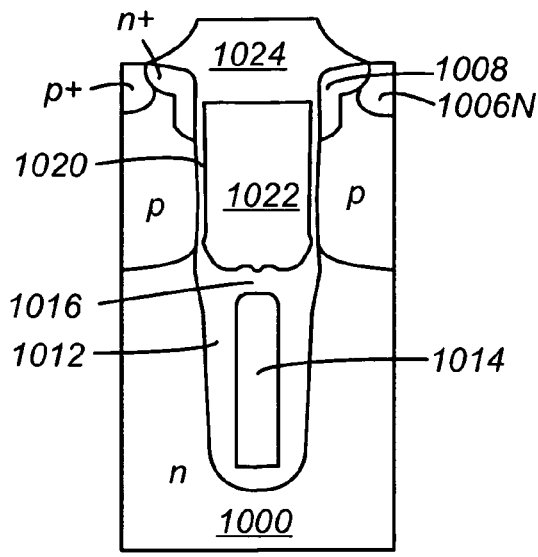
Figure 10O:
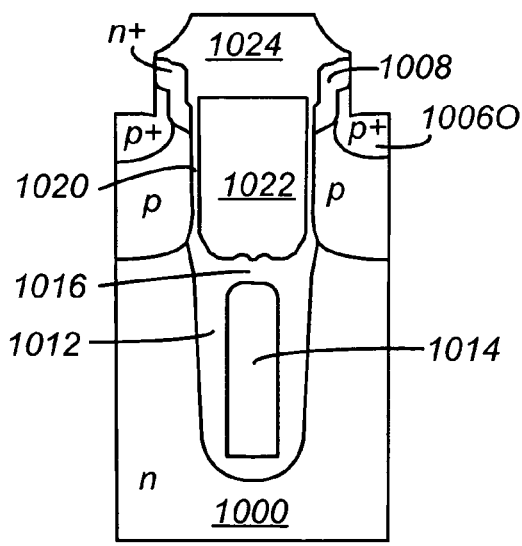
Figure 10P:
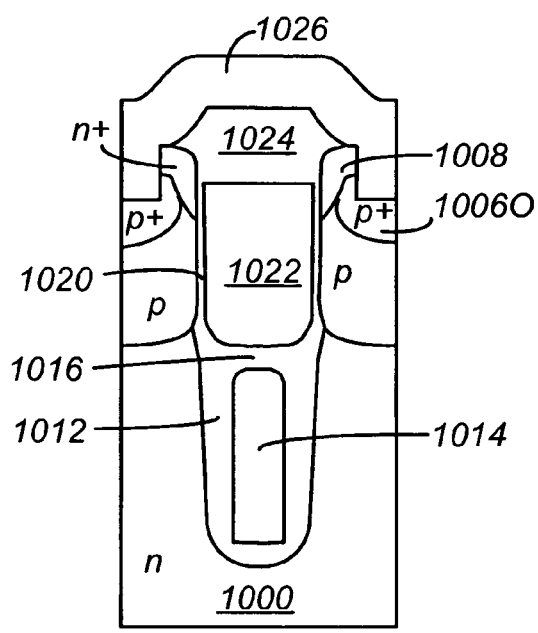

FIGS. 10A-10P are simplified cross sectional views depicting a process flow for forming a self-aligned shielded gate trench FET in accordance with yet another embodiment of the invention. In the process of FIGS. 10A-10P, the dielectric spacers for self-alignment of the source regions are formed off of the nitride hard mask at the start of the process flow and before filling the trench with BPSG. In contrast, the dielectric spacers for self-alignment of the source regions for the process of FIGS. 9A-9J are formed toward the end of the process flow and off of the BPSG pillar, instead of off of the nitride hard mask.

In FIG. 10A, p-type body region 1004 is formed in n-type semiconductor region 1000 using conventional body implant and drive in methods. In other embodiments, the body region is formed after the trench is formed. In FIGS. 10A and 10B, a hard mask comprising a pad oxide layer 1030 and a nitride layer 1032 is formed over body region 1004. A masking step is then carried out to form an opening in pad oxide 1030 and nitride layer 1032. A dielectric spacer 1034 is formed along the walls of the opening, thus defining a narrower opening 1033 through which trench 1010 is formed as shown in FIG. 10C. In one embodiment, pad oxide layer 1030 is about 1500 Å thick and dielectric spacer 1034 is about 0.3 μm along the lateral dimension. Spacers 1034 help shrink the minimum feature size since they define the boundaries for the source and heavy body regions formed in later steps.

In one embodiment, nitride layer 1032 is about 0.35 μm thick, and has sufficient thickness to tolerate some removal in subsequent etch steps, for example, in the silicon etch step of FIG. 10C for forming the trench. Since oxides are typically better barriers to silicon etching than nitrides, the layer of nitride 1032 should be relatively thicker than the oxides. Alternatively, a nitride layer may be formed between two oxide layers (i.e., form an ONO composite layer) with an ONO etch in subsequent etch steps, so that the nitride layer is not removed during the silicon etch. Since nitride layer 1032 serves as a spacer for the subsequent formation of self-aligned heavy body regions, thus preventing the removal of nitride layer 1032 would result in better definition for subsequent heavy body implantation. Accordingly, layer 1032 may also comprise a polyimide, oxynitride, hydrocarbon or any other dielectric that does not oxidize rapidly in oxidation steps, having a different selectivity rate than oxide, and that is selective against silicon etching. In yet other embodiments, the hard mask may be a single layer rather than multi-layer. In general, however, for various other embodiments, the thickness of the hard mask stack and of any of its layers will depend on the device pitch for particular applications.

In FIG. 10D, a shield dielectric layer 1012 (e.g., comprising oxide) lining the trench sidewalls and bottom is formed. In one embodiment, shield dielectric layer 1012 has a thickness of about 2000 Å, and is formed using thermal oxidation. In FIG. 10E, shield electrode 1014 is formed in a bottom portion of trench 1010, and then the exposed portions of the shield dielectric layer are recessed so that a thin layer of the shield dielectric (e.g., about 100-500 Å) remains along the upper trench sidewalls. Shield dielectric layer 1012 may be thinned down by performing a timed etch controlled by the desired amount of oxide to remain.

In FIG. 10F, nitride spacers 1036 is formed over the thinned shield dielectric along the upper trench sidewalls. The primary purpose of nitride spacers 1036 is to prevent the dielectric layers of subsequent steps from forming on the upper sidewalls of the trench. In FIG. 10G, IED layer 1016 is formed along exposed surface of shield electrode 1014. In one embodiment IED 1016 is formed by oxidation of silicon, and nitride spacers 1036 and nitride layer 1032 prevent formation of oxide along upper trench sidewalls and over the mesa regions. In FIG. 10H, a three step ONO etch is carried out to remove the thin oxide formed on the nitride spacers, the nitride spacer 1036, and the 100-500 Å of the oxide remaining along the upper trench sidewalls. IED layer 1016 may alternatively be formed by any one of the processes and techniques described above and incorporated herein by reference.

In FIG. 10I, a gate dielectric 1020 (e.g., comprising oxide) is formed along the upper trench sidewalls. In FIG. 10J, gate electrode 1022 is formed using known techniques. Gate electrode 1022 is recessed below the surface of the mesa region to accommodate angled source implants into upper trench sidewalls. In FIG. 10K, a dual-pass angled implant of n-type dopants is performed to form source regions 1008 in the mesa adjacent to the trench. Alternatively, a conventional, single-pass implant could be performed to form source regions 1008. In FIG. 10L, a dielectric layer (e.g., comprising BPSG) is formed and then planarized to nitride layer 1032, thus forming dielectric cap 1024 over the gate electrode.

In FIG. 10M, nitride layer 1032 is removed so that a pillar of dielectric 1024 upwardly extending over the gate electrode remains. In FIG. 10N, a dielectric etch (e.g., wet etch) of dielectric layers 1034 and 1024 is carried out to expose a surface area of the mesa regions while a surface portion of source regions 1008 remains covered by dielectric material 1024. The dielectric etch may be a timed etch or an etch with silicon as an etch stop. In FIG. 10N, a blanket heavy body implant of p-type dopants into exposed mesa surfaces is carried out to form heavy body regions 1006N in body regions 1004 adjacent source regions 1008.

As can be seen, the above process results in formation of self-aligned source and heavy body regions. In an alternate embodiment, prior to carrying out the heavy body implant, the exposed mesa regions are recessed as shown in FIG. 10O. This optional "dimple etch" increases the contact area to source regions 1008 and heavy body regions 1006O, further improving the UIS and contact resistance. Moreover, if dielectric material 1024 covers a significant amount of the surface area of source regions 1008, a dimple etch would advantageously expose sidewalls of the source regions for ohmic contact to the source interconnect layer 1026 (FIG. 10P). The embodiment without a "dimple etch" requires a higher implant energy to drive the heavy body regions deeper into the body region. In the dimple etch embodiment, the heavy body region is located deeper in the body region, and accordingly a lower energy can be used.

Figure 11A:
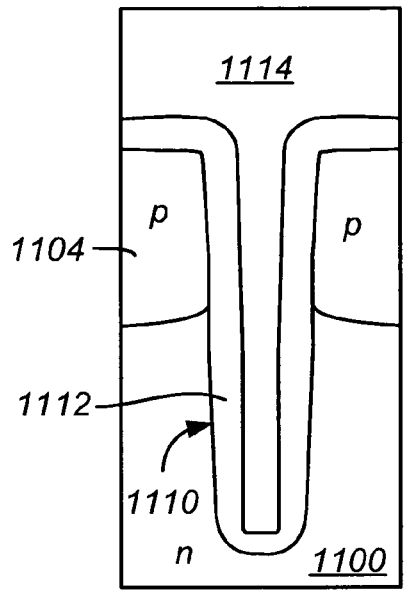
FIGS. 11A-11N are simplified cross sectional views for forming a self-aligned shielded gate trench FET in accordance with another embodiment of the invention.
Figure 11B:
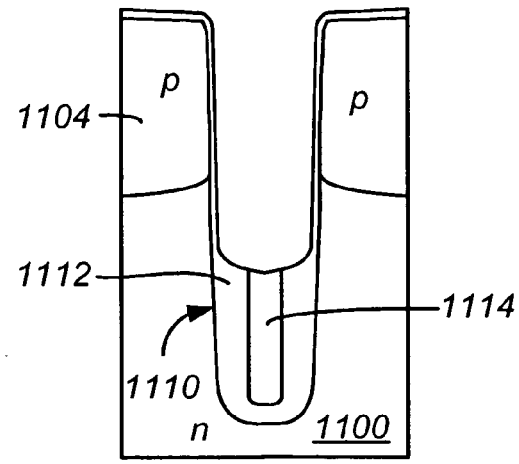
Figure 11C:
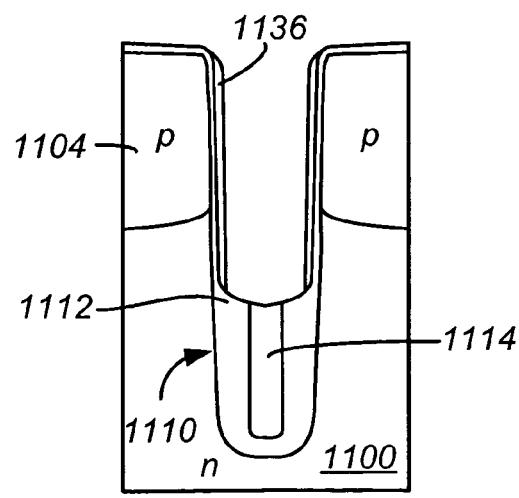
Figure 11D:
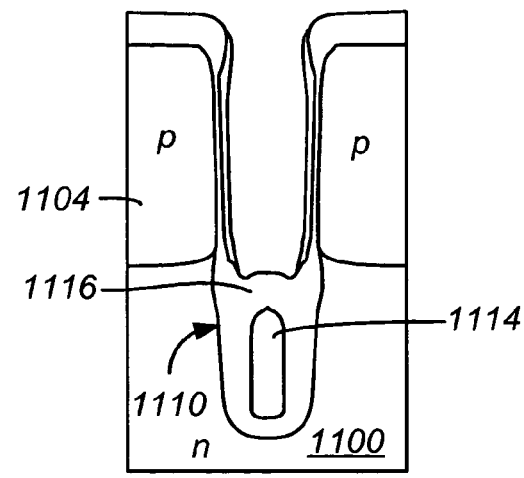
Figure 11E:
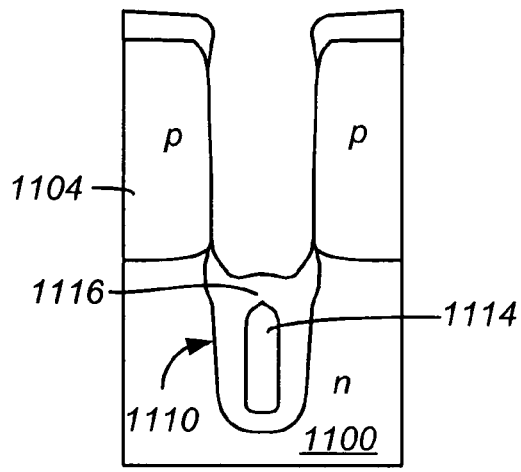
Figure 11F:
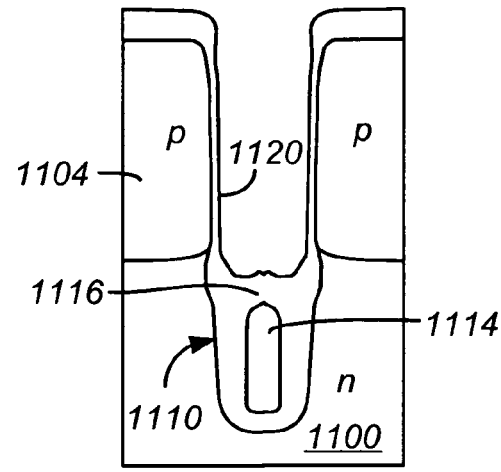
Figure 11G:
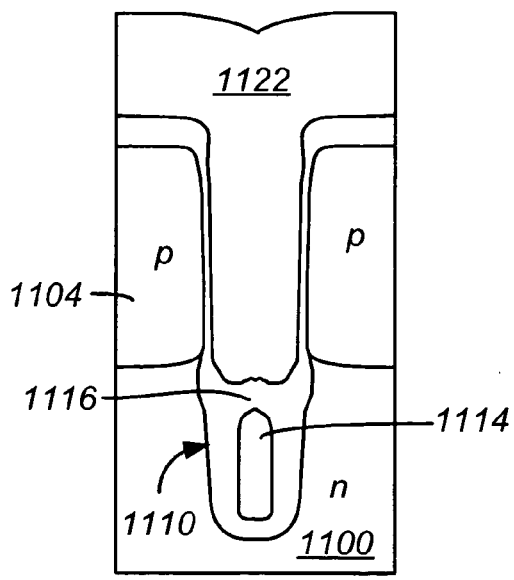
Figure 11H:
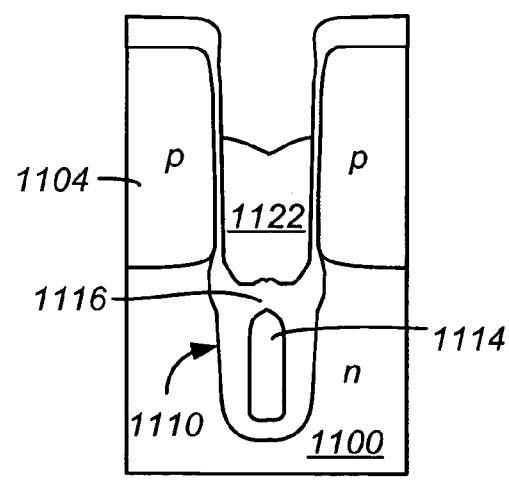
Figure 11I:
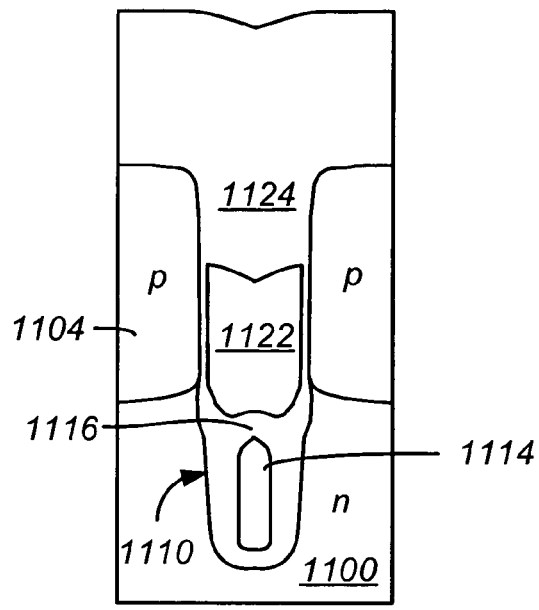
Figure 11J:
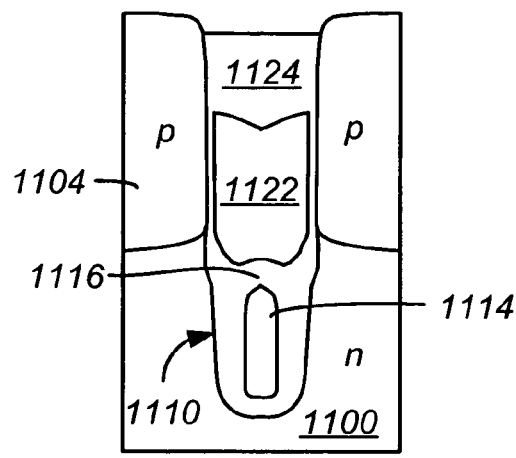
Figure 11K:
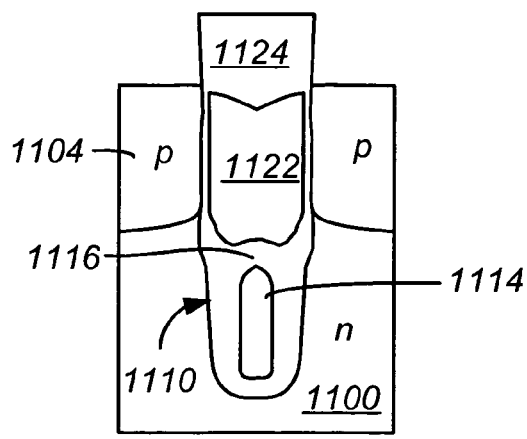
Figure 11L:
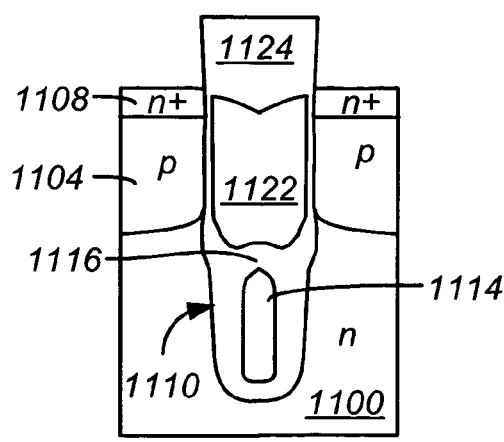
Figure 11M:
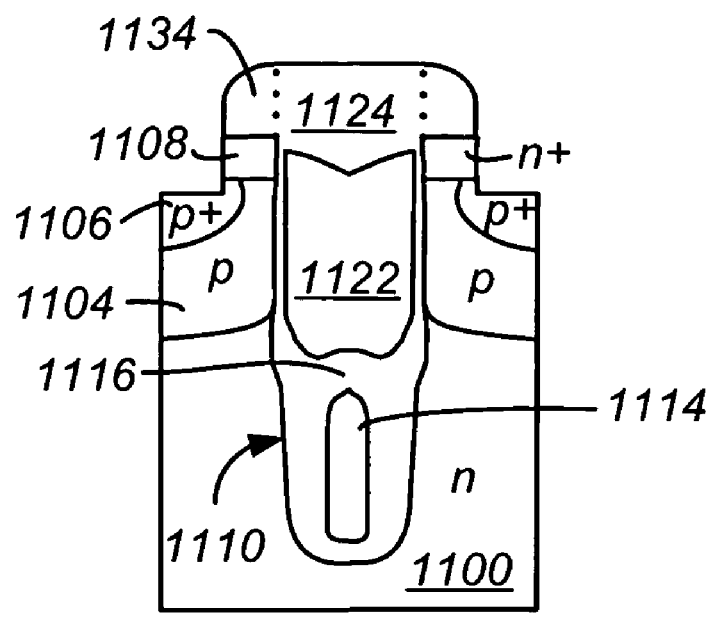
Figure 11N:
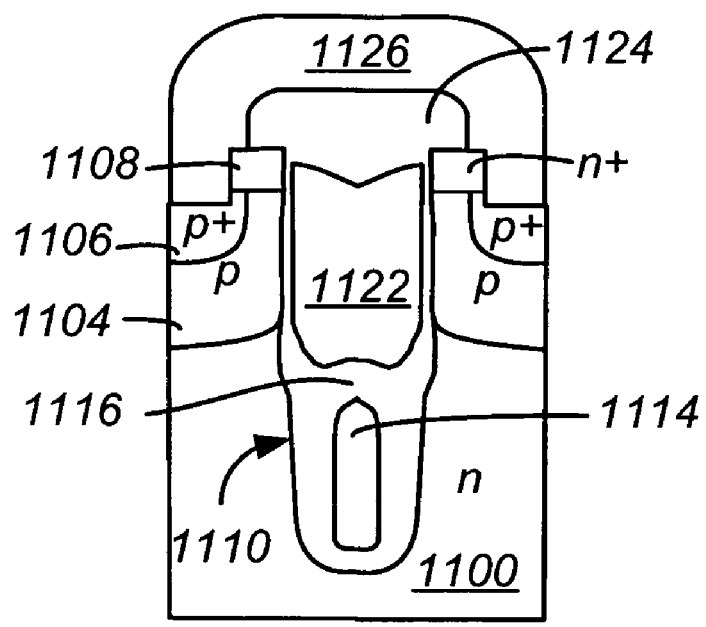

FIGS. 11A-11N are simplified cross sectional views for forming another self-aligned shielded gate trench FET in accordance with another embodiment of the invention. In FIG. 11A, a trench 1110 is formed in n-type semiconductor region 1100, followed by formation of a shield dielectric layer 1112 (e.g., comprising oxide) along trench sidewalls and bottom and over the mesa regions. A shield conducting layer 1114 (comprising polysilicon) filling trench 1110 and extending over mesa regions is formed. P-type body regions 1104 are formed using conventional implantation of p-type dopants into semiconductor region 1100. Body region 1104 may be formed before or after forming trench 1110. The whole wafer may be implanted to form the body regions, or alternatively, only the active regions may be selectively implanted and the edge structures protected against exposure to the body dopants.

In FIG. 11B, shield electrode 1114 is recessed deep into trench 1110. The exposed portion of shield dielectric 1112 is then partially removed so that a thin layer of the shield electrode remains along the trench upper sidewalls. A second shield electrode etch is carried out to recess shield electrode 1114 to about the same level or just below a recessed surface of shield dielectric 1112 in the trench adjacent shield electrode 1114. In FIG. 11C, nitride spacers 1136 are formed along upper trench sidewalls over thinned down portions of shield dielectric 1112. In FIG. 11D, IED layer 1116 is formed by a LOCOS process. However, other variations and embodiments of IED formation as discussed or incorporated herein can be used. In one embodiment, an IED layer having at thickness of about 2000 Å is formed by carrying out high temperature oxidation (e.g., at about 1100° C.) of silicon.

In FIG. 11E, the three-step ONO etch is performed to remove the nitride and oxide layers formed along the upper sidewalls of the trench. In FIG. 11F, a gate dielectric 1120 is formed, and then gate conducting layer 1122 is deposited filling the trench and extending over the mesa region as shown in FIG. 11G. In FIG. 11H, gate electrode 1122 is recessed into trench 1110. In FIG. 11I, a dielectric layer 1124 (e.g., comprising BPSG) filling trench 1110 and extending over mesa regions if formed. In FIG. 11J, dielectric layer 1124 is recessed so that it is planar with or slightly below the silicon mesa surface. In this step, silicon may be used as an etch stop for recessing dielectric layer 1124.

In FIG. 11K, the exposed silicon mesa is recessed to a level slightly above the top surface of gate electrode 1122. In one embodiment, a time silicon etch is carried out until the silicon mesa reaches about 300-1000 Å above the top surface of gate electrode 1122. This results in the formation of a dielectric pillar 1124 extending above gate electrode 1122. In FIG. 11L, n+ regions 1108 are formed along the mesa region by carrying out a blanket source implant in the active region. Any necessary threshold adjustment implant can also be carried out at this point. In one embodiment, n+ regions 1108 are formed using dual-pass, angled implantation before dielectric layer 1124 is formed in FIG. 11H. A pad oxide layer of approximately 250 Å may optionally be formed over the mesa surfaces prior to the source implant to minimize the implant damage to the silicon.

In FIG. 11M, dielectric spacers 1134 (e.g., comprising oxide) are formed on either side of dielectric pillar 1124 to cover a portion of n+ regions 1108. In other embodiments, dielectric spacers 1134 may be replaced with a nitride spaces or any other suitable spacer material that may be deposited conformally, that is, with like deposition rates in both horizontal and vertical directions so that the height and width of the spacer are substantially the same.

In one embodiment, spacers 1134 are formed as follows. A conformal film is formed over n+ regions 1108 and over dielectric pillar 1124. The conformal film is etched by a directional etch, such as a plasma anisotropic etch, so that only horizontal material is removed and a vertically aligned spacer 1134 remains against walls of dielectric pillar 1124. The plasma etch also exposes a portion of the silicon mesa surface.

In FIG. 11M, after spacers 1134 are formed, the exposed mesa surfaces are recessed to below n+ regions 1108 so that portions of n+ regions 1108 remaining below spacers 1134 form the source regions. Heavy body regions 1106 are then formed by carrying out a blanket implant of p-type dopants into the recessed silicon. In FIG. 11N, source interconnect layer 1126 contact heavy body regions 1106 and source regions 1108. As can be seen, source and heavy body regions are formed in a self-aligned manner.

In another embodiment of the process flow depicted by FIGS. 11A-11N, spacers 1134 are from polysilicon instead of a dielectric. Using polysilicon as a spacer offers several distinct advantages. Since polysilicon spacers can be doped in-situ with n-type dopants, the polysilicon spacers themselves may serve as the source regions. For example, an ISD polysilicon is automatically n-type, while a PMD polysilicon could provide a p-type layer. Thus, using the polysilicon as an n-type spacer can reduce the number of processing steps by eliminating the steps of forming n+ regions 1108, whether dimple etched or not. Using polysilicon spacers as source regions also increase the source region area thereby reducing the contact resistance. In such an embodiment, the step of forming source regions 1108 in FIG. 11L would be eliminated, and instead, spacers 1134 would be formed along the walls of dielectric pillar 1124 using known techniques.

In one variation of the polysilicon spacer embodiment, the silicon recess in FIG. 11M is not carried out prior to the heavy body implant. In another variation, silicon mesa regions defined by the opening between adjacent polysilicon spacers is recessed, followed by heavy body implant. This will push the heavy body region deeper into the body region. The optional threshold adjustment implant to set the threshold voltage of the device to its proper value could be performed after the silicon etch but before the formation of the polysilicon spacer, at FIG. 11L.

Alternatively, the source regions may be formed as shown in FIGS. 11L and 11M, and an n-type polysilicon spacer may be additionally formed above the source regions 1108 prior to heavy body implant. While not replacing the source regions, the use of a polysilicon spacer would still increase the source region area and reduce the contact resistance. Thus, when the dimple etch step is performed in FIG. 11M for such an embodiment, the surface area of the source region would be expanded in the vertical direction to include the polysilicon spacer.

Use of polysilicon spacers can also be advantageously integrated with the process flow depicted by FIGS. 8A-8E as follows. For example, in FIG. 8D, after the silicon recess, polysilicon spacers are formed along the exposed walls of dielectric cap 824B and over remaining n+ regions 808B, followed by another silicon recess of the mesa defined by the opening between adjacent polysilicon spacers. A heavy body implant into the recessed silicon is carried out next, with subsequent steps being similar to that in FIG. 8F.

The various structures and methods described above may be combined with one or more of a number of shielded gate structures and manufacturing processes as well as other device structures and manufacturing processes disclosed in the commonly assigned application Ser. No. 11/026,276, filed Dec. 29, 2004, and incorporated herein by reference in its entirety, to achieve an even lower on-resistance, higher blocking capability and higher efficiency, among other advantages and features. Further, the cross sectional views of the different embodiments may not be to scale, and as such are not intended to limit the possible variations in the layout design of the corresponding structures. Also, the various transistors can be formed in stripe or cellular architecture including hexagonal or square shaped transistor cells.

All the cross sectional views shown in the above figures are merely illustrative and are not intended to limit the layout or other structural aspects of the cell array. Moreover, the figures may not accurately reflect the actual shape of all the various regions as they would appear in an actual device. It is to be understood that the invention is not limited to a particular shape of the shielded gate trench FET shown.

Although a number of specific embodiments are shown and described above, embodiments of the invention are not limited thereto. For example, it is understood that the doping polarities of the structures shown and described could be reversed to obtain p-channel FETs, and/or the doping concentrations of the various elements could be altered without departing from the invention. As another example, the trenches in the above embodiments may terminate before reaching the more heavily doped substrate or may extend into and terminate within the substrate. Also, while the various embodiments described above are implemented in conventional silicon, these embodiments and their obvious variants can also be implemented in silicon carbide, gallium arsenide, gallium nitride, diamond or other semiconductor materials. In a further variation, the epitaxial layer may have a graded doping concentration rather than a fixed doping concentration, or may be made of a number of epitaxial layers, each having a different doping concentration, or may be eliminated altogether depending on the design objectives. Further, the features of one or more embodiments of the invention may be combined with one or more features of other embodiments of the invention without departing from the scope of the invention.

Thus, the scope of the present invention should be determined not with reference to the above description but should, instead, be determined with reference to the claims, along with their full scope of equivalents.

What is claimed is:

1. A method for forming a field effect transistor comprising:

forming a trench in a semiconductor region;

forming a dielectric layer lining the trench sidewalls and bottom;

filling the trench with a conductive material;

recessing the conductive material into the trench to thereby form a shield electrode in a bottom portion of the trench;

after the recessing step, removing exposed portions of the dielectric layer whereby the dielectric layer is recessed in the trench to below a top surface of the shield electrode;

recessing the shield electrode so that a top surface of the recessed shield electrode is substantially coplanar with a top surface of the recessed dielectric layer; and forming an inter-electrode dielectric (IED) over the recessed shield electrode.

2. The method of claim 1 wherein the recessing comprises: isotropic etching of the conductive material.

3. The method of claim 2 wherein the recessing comprises:

prior to isotropic etching, anisotropic etching of the conductive material.

4. The method of claim 2 wherein the recessing comprises:

prior to the isotropic etching, an isotropic etching of the conductive material; and after the isotropic etching, anisotropic etching of the conductive material.

5. The method of claim 2 wherein the recessing comprises:

after the isotropic etching, an isotropic etching of the conductive material; and after the anisotropic etching, isotropic etching of the conductive material.

6. The method of claim 1 further comprising forming a gate electrode in an upper portion of the trench, the gate electrode being insulated from the shield electrode by the IED.

7. The method of claim 6 wherein the semiconductor region has a first conductivity type, the method further comprising:

forming a body region of a second conductivity type in the semiconductor region; and forming source regions of the first conductivity type in the body region flanking the trench.

8. The method of claim 7 wherein the semiconductor region comprises a substrate of the first conductivity type, the method further comprising:

forming an epitaxial layer of the first conductivity type over the substrate, wherein the body region is formed in the epitaxial layer, and die french is formed so as to extend through the epitaxial layer and terminate within the substrate.

9. The method of claim 7 wherein the semiconductor region comprises a substrate of the first conductivity type, the method further comprising:

forming an epitaxial layer of the first conductivity type over the substrate, wherein the body region is formed in the epitaxial layer, and the trench is formed so as to extend into and terminate within the epitaxial layer.

10. A method for forming a field effect transistor comprising:

forming a trench in a semiconductor region;

forming a dielectric layer lining the trench sidewalls and bottom;

filling the trench with a conductive material;

recessing the conductive material into the trench to thereby form a shield electrode in a bottom portion of the trench;

after the recessing step, removing exposed portions of the dielectric layer whereby the dielectric layer is recessed in the trench to below a top surface of the shield electrode;

recessing the shield electrode to below a top surface of the recessed dielectric layer; and forming an inter-electrode dielectric (IED) over the recessed shield electrode.

11. The method of claim 10 wherein the recessing comprises:

isotropic etching of the conductive material.

12. The method of claim 11 wherein the recessing comprises:

prior to isotropic etching, anisotropic etching of the conductive material.

13. The method of claim 11 wherein the recessing comprises:

prior to the isotropic etching, anisotropic etching of the conductive material; and after the isotropic etching, anisotropic etching of the conductive material.

14. The method of claim 11 wherein the recessing comprises:

after the isotropic etching, anisotropic etching of the conductive material; and after the anisotropic etching, isotropic etching of the conductive material.

15. The method of claim 10 further comprising forming a gate electrode in an upper portion of the trench, the gate electrode being insulated from the shield electrode by the IED.

16. The method of claim 15 wherein the semiconductor region has a first conductivity type, the method further comprising:

forming a body region of a second conductivity type in the semiconductor region; and forming source regions of the first conductivity type in the body region flankling the trench.

17. The method of claim 16 wherein the semiconductor region comprises a substrate of the first conductivity type, the method further comprising:

forming an epitaxial layer of the first conductivity type over the substrate, wherein the body region is formed in the epitaxial layer, and the trench is formed so as to extend through the epitaxial layer and terminate within the substrate.

18. The method of claim 16 wherein the semiconductor region comprises a substrate of the first conductivity type, the method further comprising:

forming an epitaxial layer of the first conductivity type over the substrate, wherein the body region is formed in the epitaxial layer, and the trench is formed so as to extend into and terminate within the epitaxial layer.

* * * * *

UNITED STATES PATENT AND TRADEMARK OFFICE
CERTIFICATE OF CORRECTION

PATENT NO.        : 7,476,589 B2
APPLICATION NO.   : 11/479117
DATED             : January 13, 2009
INVENTOR(S)       : Thomas E. Grebs et al.

It is certified that error appears in the above-identified patent and that said Letters Patent is hereby corrected as shown below:

Column 8, line 67, "about $5 \times 10^9$" should be changed to "about $5 \times 10^{19}$"

Signed and Sealed this

Fourteenth Day of April, 2009

JOHN DOLL
*Acting Director of the United States Patent and Trademark Office*